(12) United States Patent
Fiorentino et al.

(10) Patent No.: US 7,313,000 B2
(45) Date of Patent: Dec. 25, 2007

(54) POWER DISTRIBUTION SYSTEM FOR A PERSONAL COMPUTER

(75) Inventors: Carl Fiorentino, Miami, FL (US); Chih-Wei Kuo, Taipei (TW)

(73) Assignee: Ultra Products, Inc., Miami, FL (US)

(*) Notice: Subject to any disclaimer, the term of this patent is extended or adjusted under 35 U.S.C. 154(b) by 170 days.

(21) Appl. No.: 11/065,617

(22) Filed: Feb. 23, 2005

(65) Prior Publication Data
US 2005/0237724 A1 Oct. 27, 2005

Related U.S. Application Data

(63) Continuation-in-part of application No. 10/936,184, filed on Sep. 8, 2004, now Pat. No. 7,133,293, which is a continuation-in-part of application No. 29/195,186, filed on Dec. 5, 2003, now Pat. No. Des. 501,648.

(51) Int. Cl.
*H05K 5/00* (2006.01)
*H05K 5/04* (2006.01)
*H05K 5/06* (2006.01)

(52) U.S. Cl. ............... 361/752; 361/753; 361/823; 439/76.1

(58) Field of Classification Search ........ 361/683–688, 361/730, 752–759
See application file for complete search history.

(56) References Cited

U.S. PATENT DOCUMENTS 5,612,854 A * 3/1997 Wiscombe et al. ......... 361/727
6,129,598 A * 10/2000 Yu et al. ..................... 439/883

* cited by examiner

*Primary Examiner*—Tuan T. Dinh
(74) *Attorney, Agent, or Firm*—Greenberg Traurig, LLP

(57) ABSTRACT

The present invention relates to power supplies, methods of installing power supplies, power distribution systems and methods of installing power distribution systems. More particularly, one embodiment of the present invention relates to a power distribution system for receiving AC current from an AC current source and for distributing DC current inside of a computer case.

18 Claims, 26 Drawing Sheets

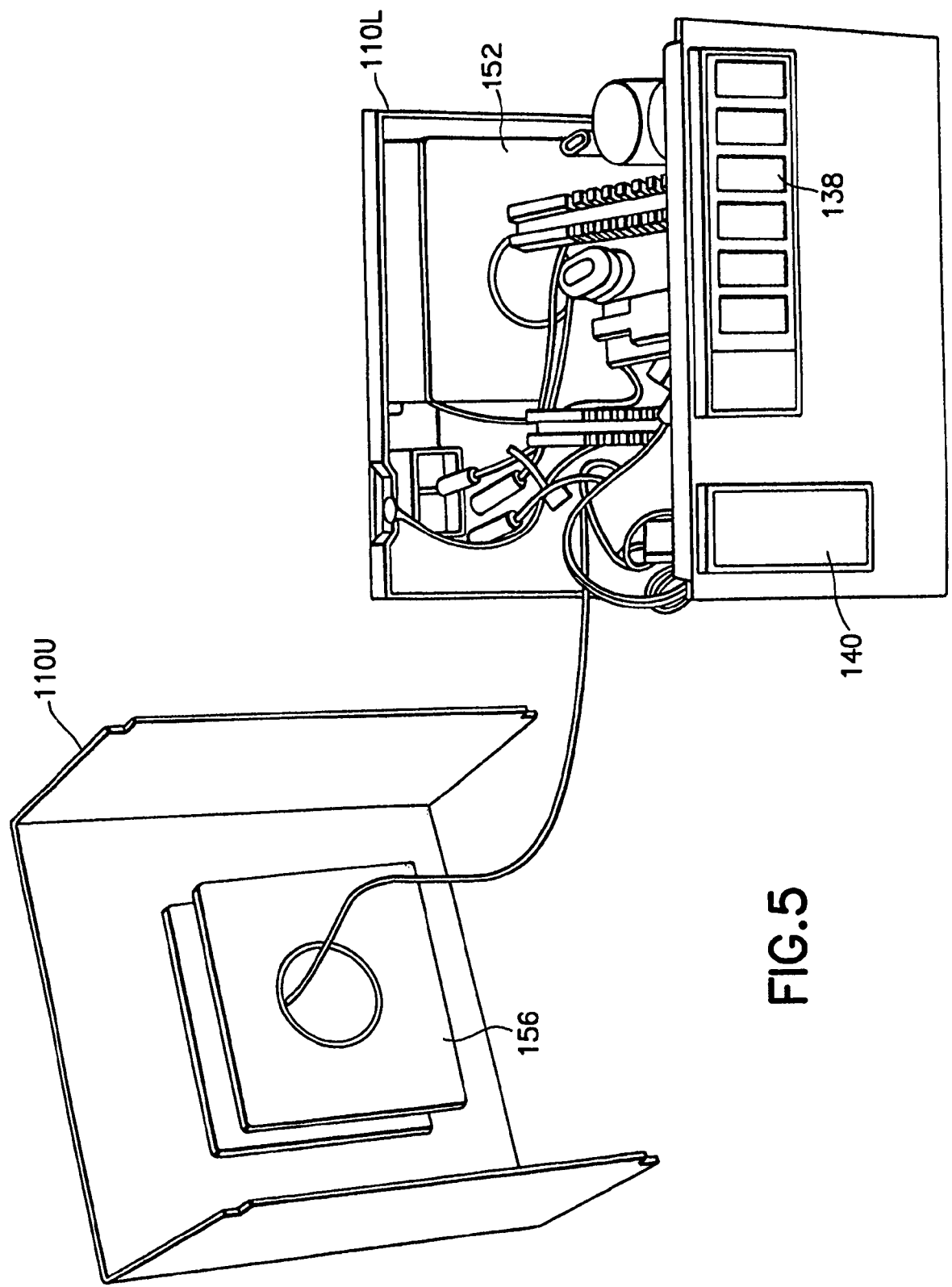

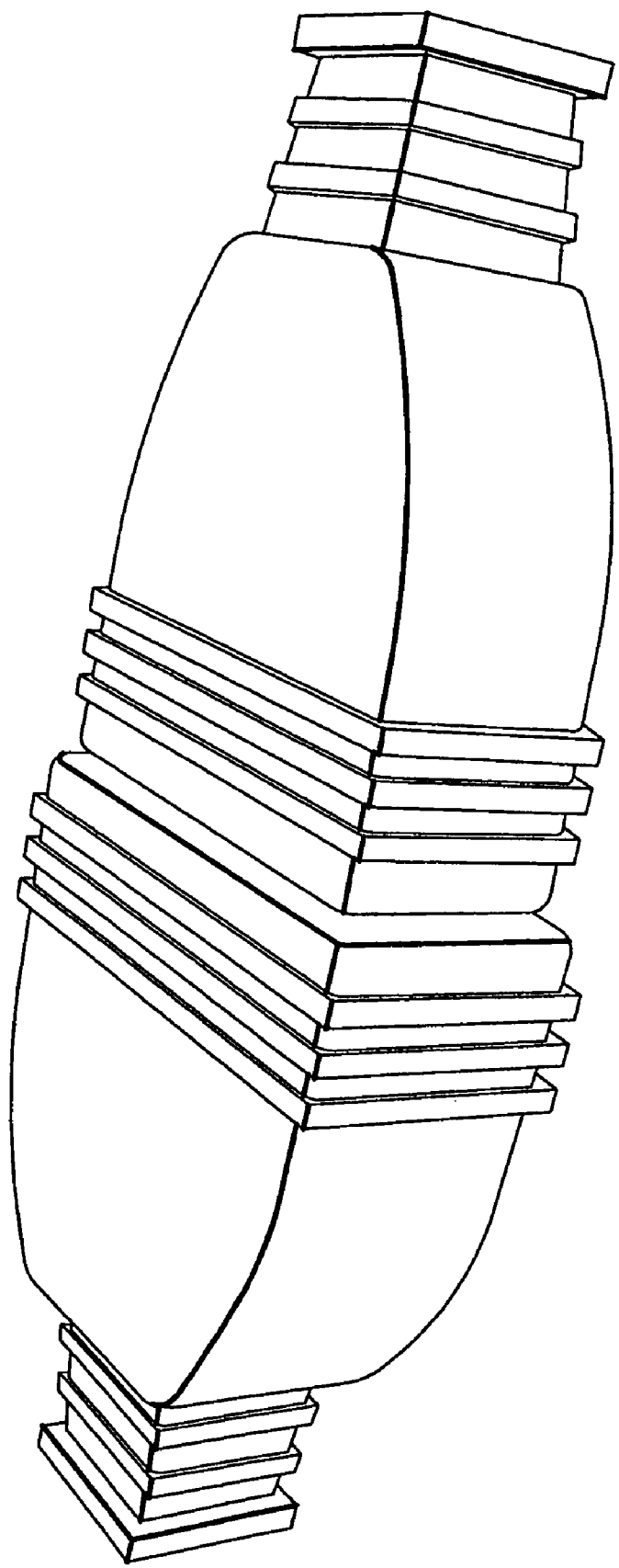

POWER DISTRIBUTION SYSTEM FOR A PERSONAL COMPUTER

CROSS-REFERENCE TO RELATED APPLICATIONS

This application is a continuation-in-part application of U.S. Ser. No. 10/936,184, filed Sep. 8, 2004 now U.S. Pat. No. 7,133,293, which is a continuation-in-part application of U.S. Ser. No. 29/195,186, filed Dec. 5, 2003 now U.S. Pat. No. D, 501,648

FIELD OF THE INVENTION

The present invention relates to power supplies, methods of installing power supplies, power distribution systems and methods of installing power distribution systems.

More particularly, one embodiment of the present invention relates to a power distribution system for receiving AC current from an AC current source and for distributing DC current inside of a computer case at least partially covering an internal frame, comprising: a power supply housing having an interior volume defined by a top panel, a bottom panel and a plurality of side panels; AC to DC circuitry disposed within the interior volume of the power supply housing; at least two DC output sockets, wherein each DC output socket is fixed to one of the top panel, bottom panel and side panels defining the interior volume of the power supply in which the AC to DC circuitry is disposed; and at least two DC distribution sockets, wherein each DC distribution socket is remote from the power supply housing and is fixed to the internal frame; wherein the AC to DC circuitry receives AC current from the AC current source; wherein the AC to DC circuitry converts the received AC current into DC current and supplies the DC current to each DC output socket; and wherein each DC output socket is fixed to one of the panels of the power supply housing in a position such that when the power supply is installed within the computer case each DC output socket is disposed inside of the computer case to allow a respective one of a plurality of removable cables to be removably connected between a single respective one of the DC output sockets and a single respective one of the DC distribution sockets.

Another embodiment of the present invention relates to a power distribution system for receiving DC current from a power supply and for distributing the DC current to at least one component disposed inside of a computer case at least partially covering an internal frame, comprising: a DC distribution socket fixed to the internal frame, wherein the DC distribution socket operatively connects with a first end of a cable removable therefrom and wherein a second end of the cable operatively connects to the power supply to supply DC current therefrom; and a DC current carrying mechanism for electrically connecting the component disposed inside of the computer case to the DC distribution socket for receiving DC current therefrom; wherein the cable is disposed entirely within the computer case and the cable is disposed at least partially inside the internal frame and at least partially outside the internal frame.

For the purposes of describing and claiming the present invention, the term "socket" is intended to refer to a device which cooperates with a "plug" (defined below) to provide a connectable/breakable electrical connection. Such a socket may have, for example, a male or female electrical terminal configuration and a male or female physical body configuration. Further, such a socket is intended to refer to a device attached to a relatively fixed structure, such as a housing.

Further, for the purposes of describing and claiming the present invention, the term "plug" is intended to refer to a device which cooperates with a "socket" (defined above) to provide a connectable/breakable electrical connection. Such a plug may have, for example, a male or female electrical terminal configuration and a male or female physical body configuration. Further, such a plug is intended to refer to a device attached to a relatively movable structure, such as an electrical cable.

Further still, for the purposes of describing and claiming the present invention, the term "component" is intended to refer to any interior element or part of a computer (e.g., personal computer) requiring a supply of power. Thus, as used herein, the term "component" is intended to include, but not be limited to: one or more motherboards, floppy disc drives, hard disc drives, CD-ROMs, CD-RWs, DVDs, sound cards, video cards, gaming cards, network cards, cooling devices, and/or network hubs.

Further still, for each term which is identified herein as "intended to include" certain definitions, when such term is used in the claims the term is to be construed more specifically as "intended to include at least one of the definitions".

BACKGROUND OF THE INVENTION

Various mechanisms for supplying power (e.g., to a computer system or other electrical device) have been proposed. Examples include the mechanisms described in the following patent documents.

U.S. Pat. No. 5,532,907 relates to a power bus that connects a matrix of power supplies to a circuit board in a computer system. The power bus is substantially planar and attached to the circuit board so that the power bus and circuit board are parallel to one another. This parallel relationship is said to decrease the amount of space utilized by the circuit board in the computer system. The circuit board also has connectors for delivering power directly to a load which is said to increase the efficiency of power delivery.

U.S. Pat. No. 5,852,544 relates to a computer assembly containing an internal power supply that powers both peripherals located within the housing of a computer and peripherals located external to the housing of the computer. The above is accomplished by using a bracket designed to use only internal supply voltage, without the use of an adapter, to connect a computer system to external peripheral devices. The bracket is attached to an expansion slot of a computer housing and is made up of a first connecting part and a second connecting part. The second connecting part is electrically connected to the first connecting part, whereby said bracket is capable of using internal supply voltage of the computer system.

U.S. Pat. No. 5,875,101 relates to a multi-layer power bus (18) that includes input tabs (24) and three legs (32, 34, and 36) and that connects a matrix of power supplies to a circuit board (12) in a computer system. The power bus (18) is substantially planar and attached to the circuit board (12) so that the power bus (18) and circuit board (12) are parallel to one another. This parallel relationship is said to decrease the amount of space utilized by the circuit board (12) in the computer system. The circuit board (12) also has connectors for delivering power directly to tabs (72, 74) on circuit board (12) which is said to increase the efficiency of power delivery. Each connector (44) includes a U-shaped spring housing (48) located within a hollow shield (52) and is joined to one of the power bus voltage layers by a braided copper cable (46).

U.S. Pat. No. 5,880,932 relates to a modular power supply to be used in a personal computer or other similar device. The preferred embodiment of the present invention includes a base assembly, a power supply housing, a power supply, and a fan assembly. The base assembly provides a foundation for the modular power supply and includes a terminal board attached thereto and a system common quick-disconnect embedded therein which serves as a central junction for the distribution of power to the various electrical components. The power supply housing provides a protective structure for the power supply contained therein. The fan assembly provides cooling for the power supply and is mounted on the outside of the power supply housing. The power supply is electrically connected to the system common quick disconnect which in turn feeds the terminal board attached to the base assembly, the fan assembly, and any other components located within the base assembly. The terminal board provides access to power for peripheral components such as logic cards, I/O boards, and the like. The use of multiple quick-disconnect electrical connectors allows components such as the power supply and fans to be replaced without detaching the components which are normally "hard wired" to the power supply.

U.S. Pat. No. 6,038,126 relates to an electrical power supply assembly including a base member, a cover member connected to the base member to confine a space, at least one partitioning plate disposed between the base and cover members to divide the space into a plurality of side-by-side adjacent compartments, a plurality of rails disposed on the base and cover members and the partitioning plate, a plurality of electrical power supply units slidably disposed inside the space and having slide members held slidably by the rails, a rear cover attached to the base and cover members, an electrical circuit board mounted on the rear cover and electrically connected to the power supply units, and an electrical control box disposed outwardly of the space and connected to the base and cover members and the rear cover.

U.S. Pat. No. 6,129,598 relates to a power supply system with a modularized and integrated cable interface configuration for providing power from an external power source to a plurality of subsystems in a personal computer. The power supply system includes a power cable for connecting the power supply system to the external power source. The power supply system further includes an output (O/P) cable having a first end and second end, the O/P cable including a plurality of cable groups wherein each of the cable groups including a subsystem plug module on the first end for connecting to a corresponding PC subsystems. The power supply system further includes an integrated PC receptive module for providing an interface with the O/P cable. The O/P cable further including an integrated O/P cable plug module on the second end for plugging the O/P cable into the integrated receptive module, wherein the integrated O/P plug module being in electric connection to each of the cable groups. The O/P cable of the power supply system may be conveniently removed and separately designed and manufactured for connection to different types of the personal computers. In another preferred embodiment, the integrated PC receptive module is a standardized module suitable for providing power to many different types for the PC subsystems by utilizing different designs and combinations of the O/P cable groups.

U.S. Pat. No. 6,327,157 relates to a two-piece bus bar which electrically couples a printed circuit board to a power supply. The power supply is mounted to a chassis. A power supply bus bar extends from the power supply, defining a power supply bus bar plane. A first printed circuit board is mounted to the chassis and oriented in a plane that is not parallel with the power supply bus bar plane. A first printed circuit board bus bar extends from the first printed circuit board. At least one of the power supply bus bar or the first printed circuit board bus bar includes a bend that creates a parallel relationship between a mating portion of the power supply bus bar and a mating portion of the first printed circuit board bus bar. A first fastener couples the mating portions of the bus bars together. A second printed circuit board may be mounted to the chassis and oriented in a plane at right angles with the power supply bus bar plane. A second printed circuit board bus bar extends from the second printed circuit board and includes a 90-degree bend and a 180-degree bend such that a mating portion of the second printed circuit board bus bar is parallel with the power supply bus bar plane. A resilient conductive member having a convex surface is disposed within a channel formed in one of the bus bars to enhance electrical contact between the bus bars. Shock and short-circuit hazards are reduced with a removable insulating shield.

U.S. Pat. No. 6,336,828 relates to an automatic power docking mechanism for establishing a power connection between a computer electronic subsystem and a power distribution board within a computer chassis. In one embodiment, the power docking mechanism includes power pads electrically coupled to a power distribution board and a housing with slotted openings secured over the power pads. The housing's slotted openings are configured to receive power bus bars from a computer subsystem and hold the bus bars in contact with the power pads.

U.S. Pat. No. 6,535,377 relates to a power distribution unit (PDU) for supplying power to at least one electrical device (APP1-APP12). The PDU comprises at least one distribution point (P) for the power supply, and at least one female outlet (J1-J12) on its accessible side. The outlet is adapted to receive a male connector of a cable of an electrical device (APP1-APP12). The point (P) is electrically connected by a respective electrical cable to at least one manually resettable circuit breaker (BRK1-BKR6). The at least one circuit breaker comprises a respective push button (POU1-POU6) for resetting the circuit breaker. The circuit breaker (BRK1-BRK6) is connected by a respective electrical cable to the at least one female outlet (J1-J12). The circuit breaker (BRK1-BRK6) is located inside the unit and at least one reset mechanism capable of resetting the at least one circuit breaker is provided. Several circuit breakers may be supported in line and the reset mechanism is capable of resetting all of the circuit breakers simultaneously. The push button may be responsive to the condition of the circuit breaker with an end extending beyond the wall for the distribution power unit so as to provide a visual indication that an electrical failure has occurred in one of the electrical devices.

U.S. Pat. No. 6,677,687 relates to a system for distributing power in a compact peripheral component interconnect (CPCI) computer architecture. A CPCI computer architecture comprises a plurality of CPCI systems each having respective backplanes. The backplanes further have respective local power rails providing power for a corresponding one of the plurality of CPCI systems. The power distribution system provides power to the backplanes, and comprises a common power rail connected to each one of the local power rails of the backplanes. A plurality of power supplies is connected to the common power rail of the power distribution system. Power taken from any one of the plurality of power supplies is available to any one of the backplanes.

U.S. Pat. No. 6,744,628 relates to a multi-directional power distribution unit (PDU) which provides flexibility in the configuration of a computer system, disk drive array or other enclosure. The power distribution unit may be installed in one orientation for a power feed having a first configuration (e.g., from the front of the enclosure), and may be installed in a second orientation for a power feed in a second configuration (e.g., from the rear of the enclosure). In either orientation, a set of external power connectors couples to one or more external power feeds. Depending on the orientation, either a first or second internal connector will interface with the system or enclosure (e.g., a midplane, a power supply). The PDU may include circuitry for filtering electrical power and may also include a heat sink.

U.S. Patent Publication No. U.S. 2003121689 relates to systems and method for installing computer equipment and power distribution equipment in facilities. In one aspect, the invention provides a power distribution rack, and uninterruptible power supply rack and a plurality of equipment racks. A plurality of power cables are run from the power distribution rack to each of the plurality of equipment racks using power cable tracks located on the roofs of the equipment racks. A plurality of data cables run between the plurality of equipment racks using data cable tracks located on the roofs of the equipment racks. The power cable tracks and data cable tracks are designed to be installed on the roofs of the equipment racks without the need for tools.

U.S. Patent Publication No. U.S. 2004000815 relates to a modular power distribution system for distributing power within an equipment rack. A control unit is mounted within the rack having a power input connected to a power source and a converter for converting the input power to a power supply for the rack equipment. The control unit includes a housing and power outlets are provided for electrical connection to the control unit and distributing the converted power supply to the equipment. One or more extension bars are mounted within the rack adjacent a corner support of the rack. The extension bar includes a power inlet and is connected via an electrical conductor to one of the power outlets of the control unit. The extension bar includes a number of power outlets (such as up to or more than 8) adapted for electrical connection to power supply lines (cords or hardwiring) from the rack equipment.

PCT Patent Publication No. WO02075886 relates to a system and method for installing computer equipment and power distribution equipment in facilities. In one aspect, the invention provides a power distribution rack (210A, 210B), and uninterruptible power supply rack (208A, 208B) and a plurality of equipment racks (214). A plurality of power cables (290A-290D) are run from the power distribution rack (210A, 210B) to each of the plurality of equipment racks (214) using power cable tracks (282A-282E) located on the roofs of the equipment racks (214).

BRIEF DESCRIPTION OF THE DRAWINGS

FIG. 5 is a perspective view of a computer power supply according to another embodiment of the present invention (showing the clamshell nature of the housing of this embodiment);

FIGS. 10A-10H show views of covers for plastic injection molded type plugs according to embodiments of the present invention;

Figure 1:
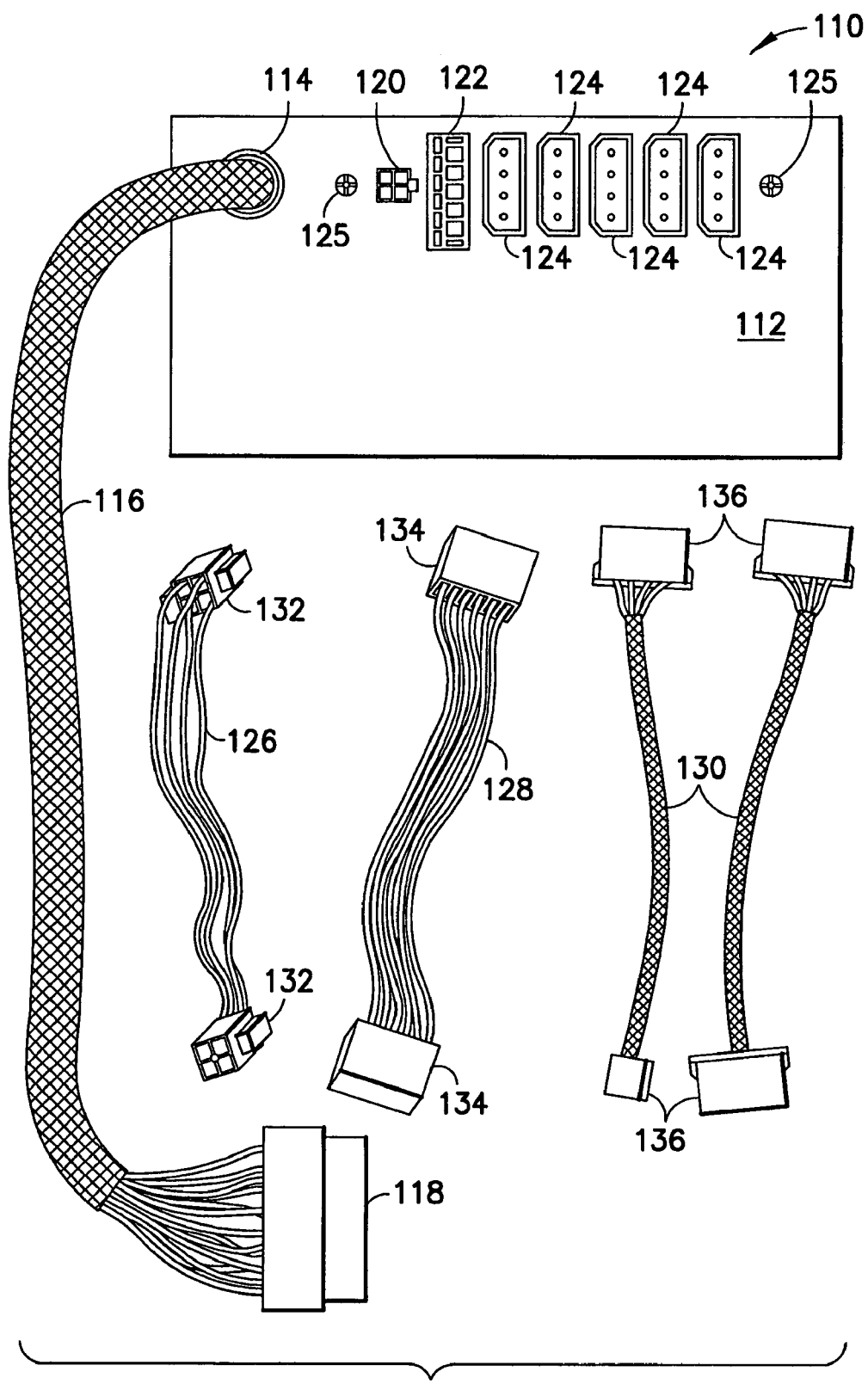
FIG. 1 is a front view of a computer power supply according to an embodiment of the present invention (wherein the power supply is shown with a wired motherboard cable and with integral sockets for receiving removable plugs of power cables)

Among those benefits and improvements that have been disclosed, other objects and advantages of this invention will become apparent from the following description taken in conjunction with the accompanying figures. The figures constitute a part of this specification and include illustrative embodiments of the present invention and illustrate various objects and features thereof.

DETAILED DESCRIPTION OF THE INVENTION

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

Referring now to a brief description of a number of embodiments of the present invention, it is noted that one of these embodiments relates to a computer power supply including at least one electrical socket which is electrically coupled to a DC source by way of an electrically conductive path which includes no wires disposed exteriorly of the housing of the power supply. This socket may be accessible from the exterior of the power supply housing to permit the physical and electrical connection of the socket to a plug of a removable cable for providing DC power to any desired component of a computer. The socket and plug may be of any desired form factor and may include any number and configuration of electrical terminals as required for making connections to a given component disposed within the computer.

Further, another embodiment of the present invention relates to a computer power supply having output sockets configured to reduce or eliminate the presence of unsightly and/or wasteful unused power supply cables within the enclosure of the computer.

Further still, another embodiment of the present invention relates to a method of installing a power supply in a computer using only the number of necessary power supply cables for a given computer configuration (e.g., for a computer configuration utilizing a given number and type of components). That is, only the number of cables needed at a given time may need be installed.

Further still, another embodiment of the present invention relates to a method of installing a power supply in a computer using power supply cables of a specific length appropriate for a given computer configuration (e.g., for a computer configuration utilizing a given number and type of components). That is, such removable cables may be selected to be of a sufficient length to reach a given component without excess (which excess may be unsightly and/or wasteful (e.g., in terms of wasted material and/or in terms of a needless amount of electrical resistance being added to the power distribution path)).

Referring now to FIG. 1, a front view showing a modular cable configuration of a power supply according to one embodiment of the present invention is shown. Specifically, the power supply 110 comprises a housing including front panel 112 through which is formed a grommeted hole 114. The grommeted hole 114 receives a motherboard cable 116 having a motherboard plug 118 on an end thereof.

The front panel 112 further includes a plurality of holes for receiving sockets 120, 122 and 124 for supplying 12 volt power, auxiliary power and peripheral power, respectively. In one example (which example is intended to be illustrative and not restrictive), the sockets 120, 122 and 124 may be mounted on a printed circuit board (such printed circuit board may be in turn affixed to the inside of the front panel (e.g., via mounting screws 125)).

The invention may further comprise a plurality of cables configured with plugs 132, 134 and 136 at both ends to form a 12 volt power cable 126, an auxiliary power cable 128 and peripheral power cables 130, respectively. The plugs 132, 134 and 136 may be configured to plug at one end of a respective cable into respective sockets 120, 122 and 124. In addition, the plugs 132, 134 and 136 may be configured to plug at the other end of a respective cable into corresponding sockets formed in certain components contained within the device (e.g., personal computer) in which the power supply 110 is used.

In one example (which example is intended to be illustrative and not restrictive), sockets 120, 122 and 124 as well as plugs 132, 134 and 136 may be of a conventional form factor and may be male or female as required.

In another example (which example is intended to be illustrative and not restrictive), motherboard cable 116 and motherboard socket 118 may be of a conventional form factor (the socket 118 may be male or female as required).

In another example (which example is intended to be illustrative and not restrictive), sockets 120, 122 and 124 may be positioned through individual holes, appropriately configured, formed in the front panel 112 of the power supply 110 (see FIG. 1).

Figure 2:
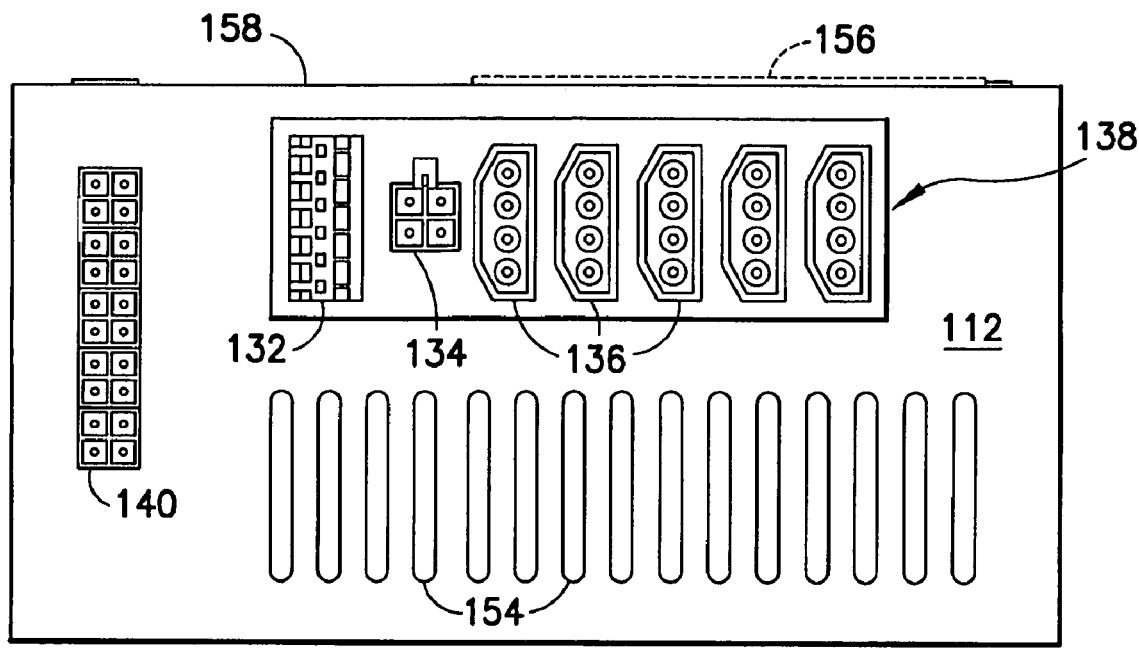
FIG. 2 is a front view of a computer power supply according to an embodiment of the present invention (wherein the power supply is shown with a motherboard socket for receiving a removable motherboard cable and with integral power sockets for receiving removable plugs of power cables)

In another example (which example is intended to be illustrative and not restrictive), sockets 132, 134 and 136 may be integrally formed with each other as an integral connector 138 (see FIG. 2).

In another example (which example is intended to be illustrative and not restrictive), an individual socket and/or an integral connector may be attached to the power supply 110 with a flange. In a more specific example (which example is intended to be illustrative and not restrictive), the socket or integral connector may be positioned through a correspondingly configured hole in the front panel 112 such that the flange rests on the outside surface of the front panel 112 with the socket or integral connector being held into position (e.g., by spring-loaded tabs).

Of note, while the motherboard cable 116 is hard-wired to the power supply 110 in the embodiment shown in FIG. 1, the motherboard cable would be configured as a modular cable (not shown) with plugs formed on both ends in the embodiment shown in FIG. 2. More particularly, the embodiment shown in FIG. 2 includes a motherboard socket 140 positioned through a corresponding hole formed in the front panel 112 of the power supply 110. This motherboard socket 140 would, of course, be configured to receive one plug of the modular motherboard cable (while the other plug of the modular motherboard cable would be received by a socket fixed to the motherboard).

Figure 3:
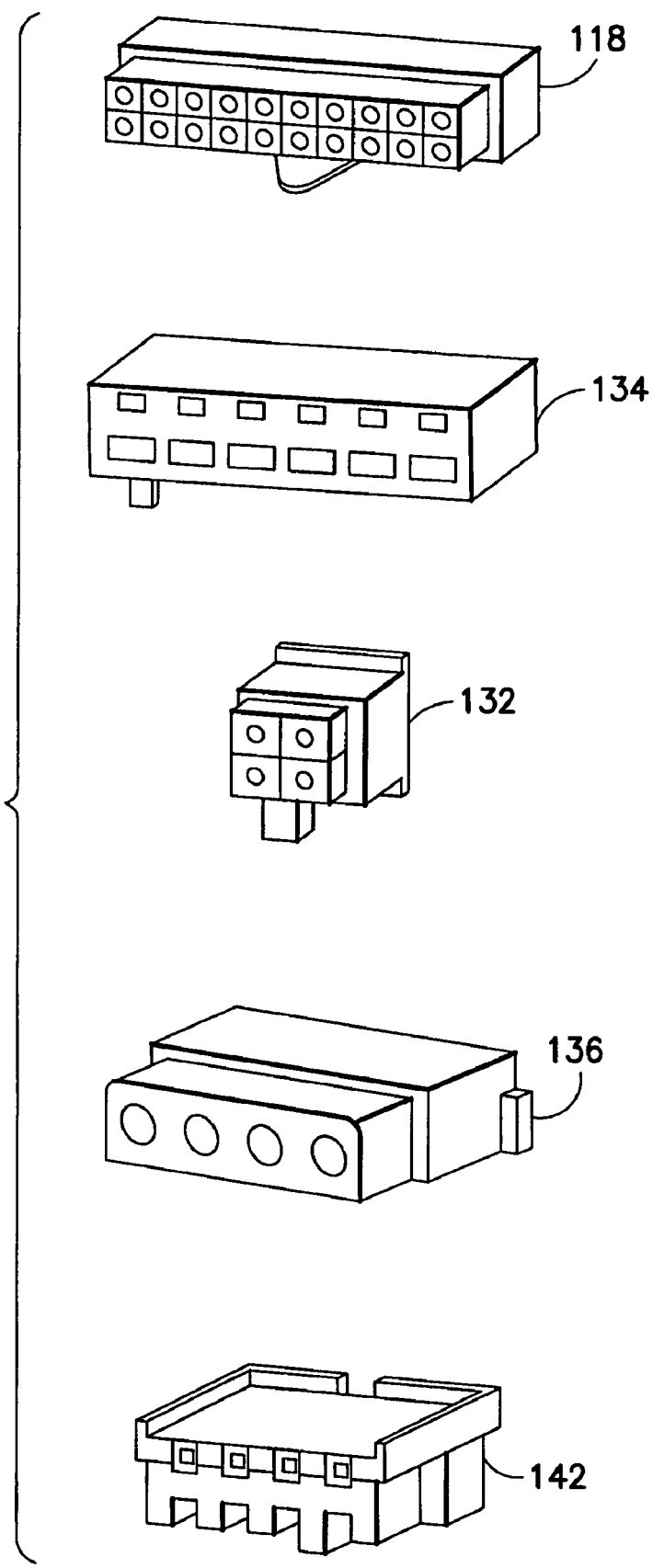
FIG. 3 is a table illustrating conventional form factors commonly employed for terminating personal computer power cables.
Figure 6A:
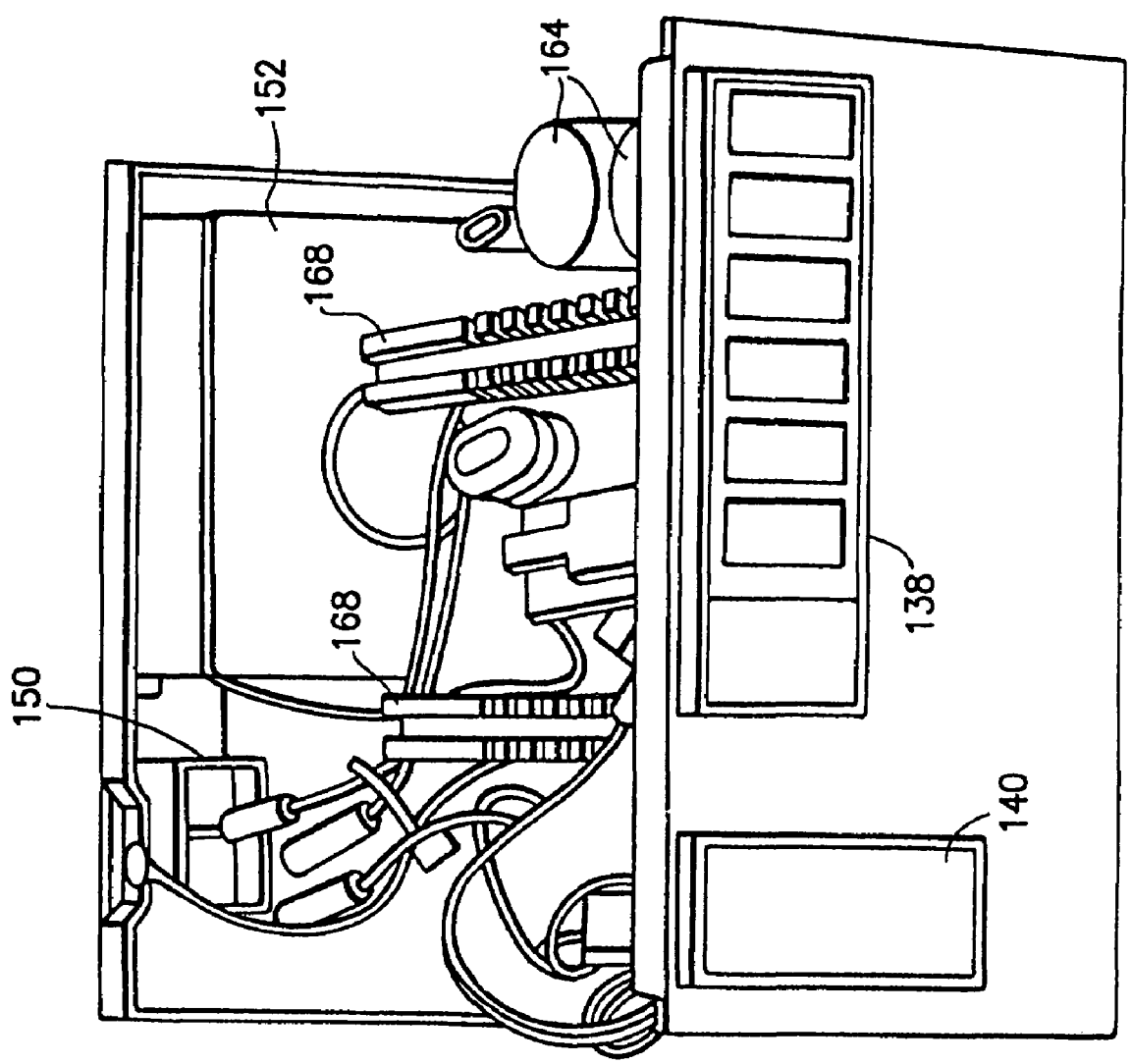
FIGS. 6A-6E are front perspective, rear perspective, left side perspective, right side perspective, and top views of the bottom portion of the power supply shown in FIG. 5 (showing the internal components thereof and the manner in which the power supply is constructed)
Figure 6B:
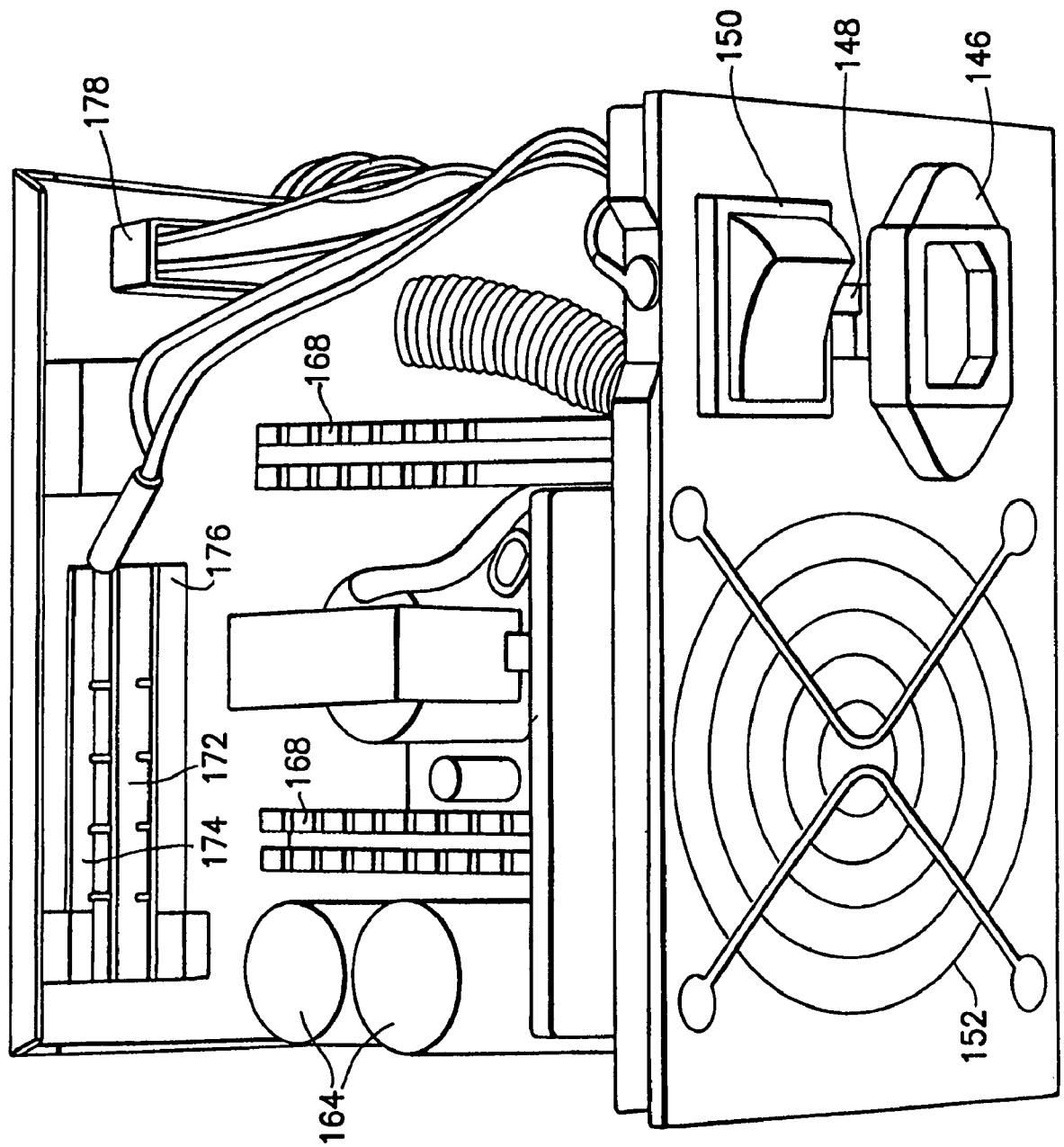
Figure 6C:
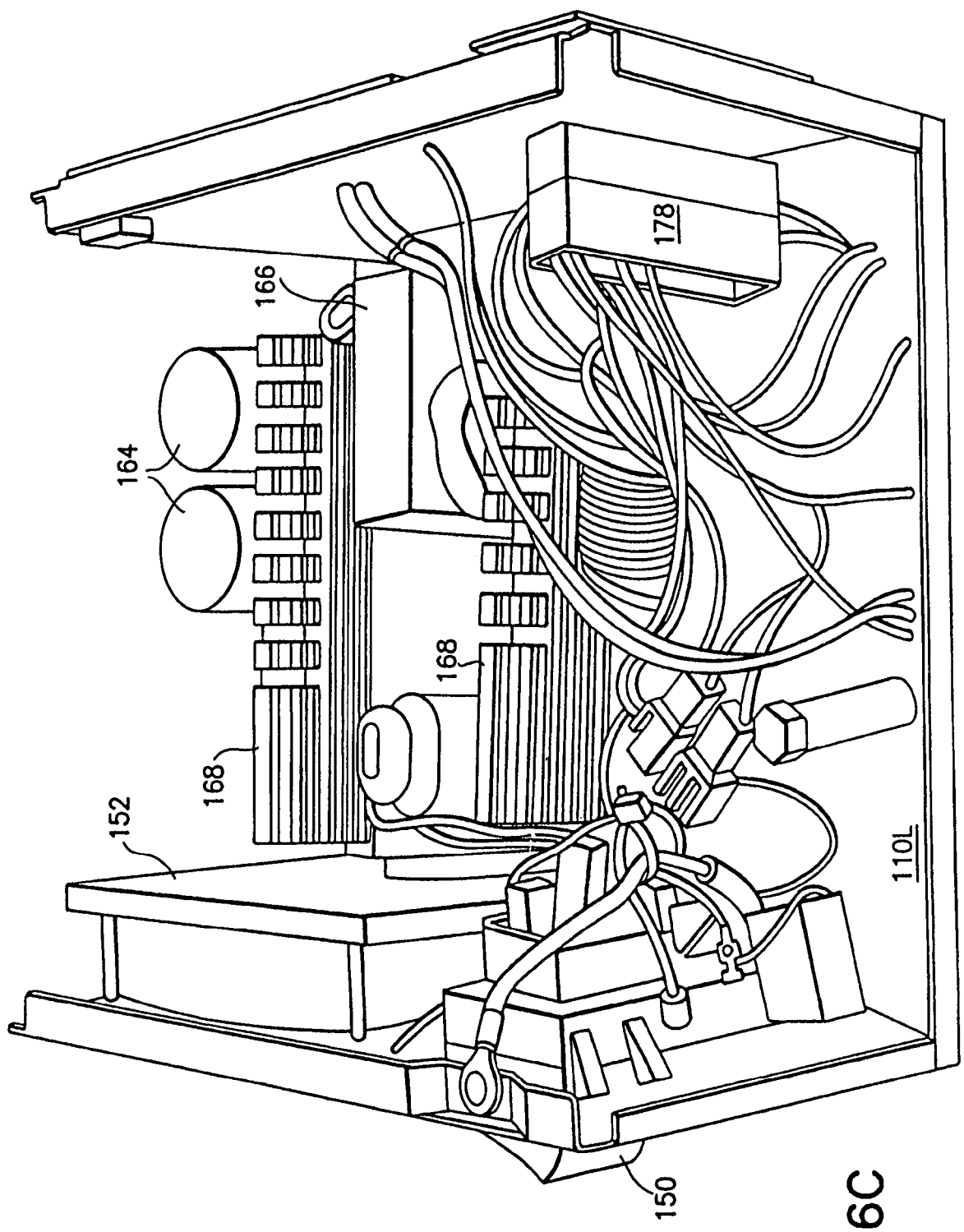
Figure 6D:
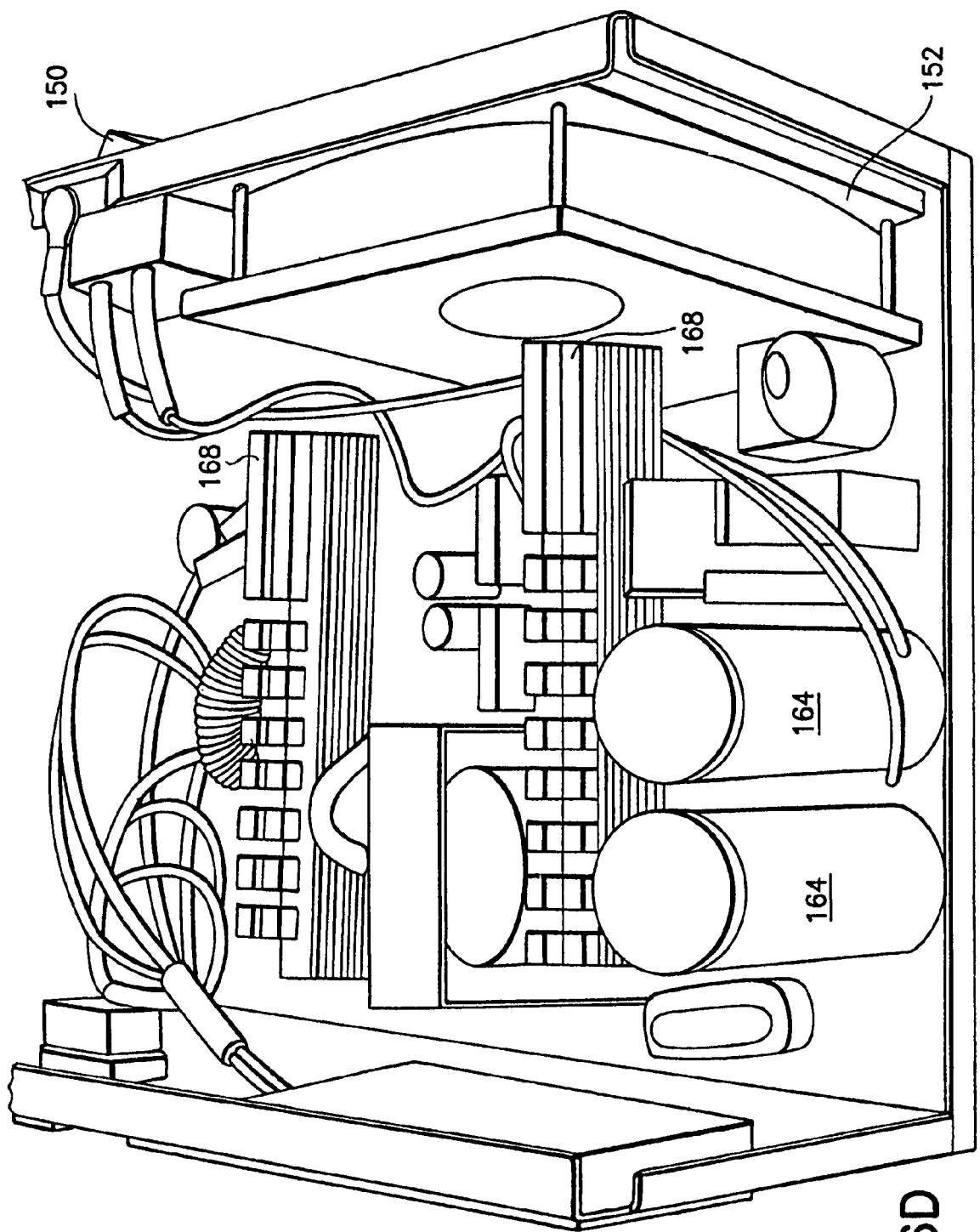
Figure 6E:
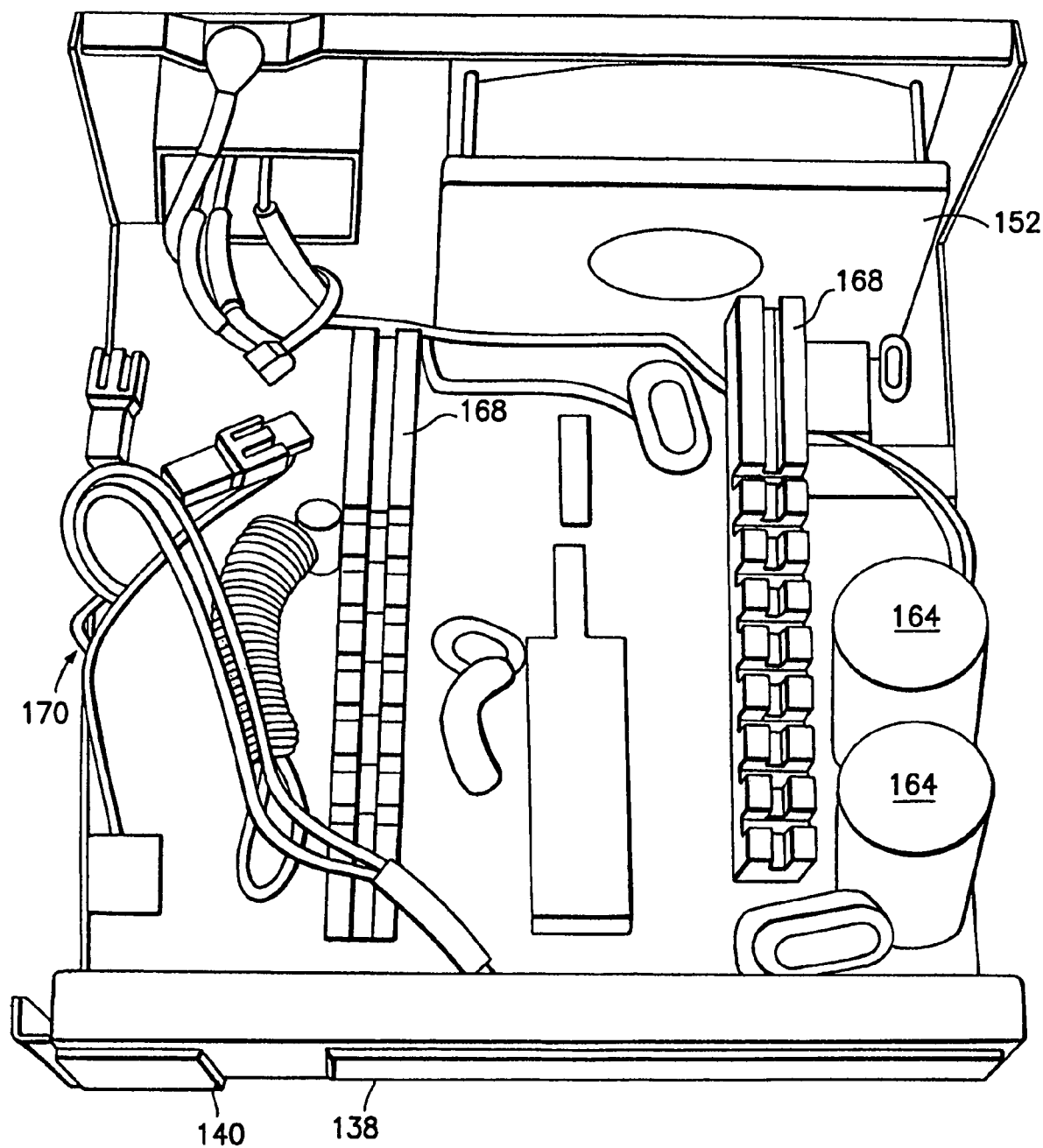

Referring now to FIG. 3, it is noted that this Figure illustrates a number of conventional connector form factors typically employed in power supplies (e.g., power supplies for personal computers). Specifically, power supplies typically include a motherboard (or main power) cable with a plug of the type of plug 118, an auxiliary power cable (or aux power) with a plug of the type of plug 134, a 12 volt power cable with a plug of the type of plug 132 and peripheral power cable with a plug of the type of plug 136. In addition, while floppy drives have been widely used in the past, their prevalence has dwindled over the years. Nevertheless, the power supply 110 of the invention may include a floppy power cable having a plug of the type of plug 142 formed on the ends thereof such that one end plugs into a corresponding floppy power socket positioned through a hole in the front panel 112 of the power supply 110 and the other end plugs into the floppy drive. Of course, it should be appreciated that while the plugs shown in FIG. 5 may be in common use today, other plugs may be employed in the future and may, without departing from the spirit and scope of the present invention, be utilized.

Figure 4:
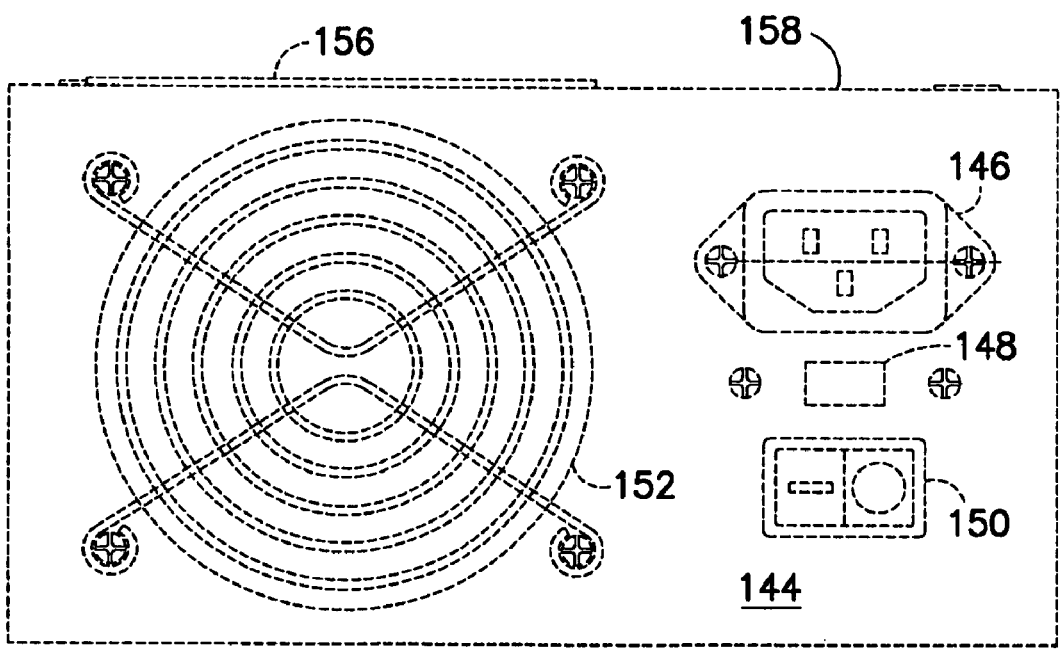
FIG. 4 is a rear view of the power supply of FIG. 2 (showing a rear ventilation fan, a power input, a voltage selector and a main power switch)

Referring now to FIG. 4, a rear panel of power supply 110 according to an embodiment of the present invention is shown. As seen in this Figure, mounted to the rear panel 144 of the power supply 110 may be a conventional input socket 146 (e.g., a 115V or 230V input socket), a conventional voltage selection switch 148 (e.g., 115V versus 230V) and a conventional on/off switch 150. The input socket 146 may be, for example, of the conventional type used within the personal computer industry which allows connection of a power cord thereto to supply current from a receptacle or other outlet to the power supply 110. Further, the supply of power may be controlled by the on/off switch 150. Further still, the voltage switch 148 may be, for example, of the conventional type in the industry to allow selection of 115V versus 230V operation of the power supply 110.

FIG. 4 also illustrates a circulation fan 152 mounted to the rear panel 144 (e.g., with appropriate grill work that allows the flow of air through the power supply 110 to exit the same via vent holes 154 formed in the front panel 112 of the power supply 110 (see FIG. 2). In one example (which example is intended to be illustrative and not restrictive), another circulation fan 156 may be provided in the top panel 158 of the power supply 110.

Referring now to FIG. 5, one example (which example is intended to be illustrative and not restrictive), of the construction of the power supply housing is shown. More particularly, it is seen in this example that the power supply 110 may comprise two complementary U-shaped portions 110U and 110L that fit together in a clamshell manner (to be secured together by appropriate fasteners) to thereby essentially fully enclose the power supply circuitry therein. This FIG. 5 also shows that in one example (which example is intended to be illustrative and not restrictive), a removable cap may be snapped into each unused socket to prevent contamination thereof.

Of note, the power supply 110 may facilitate the compact and efficient positioning of the power supply circuitry within the interior of the power supply 110. In this regard, it must first be pointed out that the present invention is not limited to any particular power supply circuit type, topography, or rating. For example, existing power supply circuit designs may be employed to provide output power in different voltages (e.g., 3.3V, 5V, 12V) and/or in different amounts (e.g., 300 or 400 watts). In addition, it is contemplated that future designs of power supply circuits will be developed and may be incorporated into the power supply of the present invention without departing from the spirit and scope thereof.

In any case, it is known today that typical power supply circuits will generally comprise some basic components. FIGS. 6A, 6B, 6C, 6D and 6E illustrate a layout for the basic components of a typical power supply that may employed. As shown, a power supply circuit may be conventionally mounted on a printed circuit board permanently affixed to the bottom panel of the lower portion 110L of the power supply 110 by appropriate stand-offs or insulators common in the industry. Line voltage from the input socket 146 is connected through the on/off switch 150 to the input power line of the printed circuit board. Connected to the printed circuit board are the input filter capacitors 164 and transformer 166 (heat sinks 168 may be thermally connected to the power transistors). Output circuitry 170 is also mounted to the printed circuit board. The motherboard socket 140 is wired to the printed circuit board. Likewise, the 12 volt power socket, the auxiliary power socket and the peripheral power socket (collectively identified as integrated connector 138) are wired to the printed circuit board. Further, the voltage selection switch 148 is wired to the printed circuit board. Further still, circulation fans 152 and 156 are either wired to the printed circuit board or otherwise configured to receive power.

In one example (which example is intended to be illustrative and not restrictive), the heat sinks 168 may comprise a generally elongated design aligned relative to the airflow created between the circulation fan 152 and vent holes 154 to facilitate the flow of air across the heat sinks 168 upon operation of the circulation fan 152.

As mentioned above, the 12 volt power, auxiliary power and peripheral power sockets may be formed together as an integral unit. In one example (which example is intended to be illustrative and not restrictive), the integral unit may be produced by injection molding or other manufacturing technique to define the integral connector 138.

In another example, terminals of the 12 volt power, auxiliary power and peripheral power sockets may be connected by means of buses 172, 174 and 176 (see FIG. 6B) to supply ground and plus and minus voltages to the respective terminals of the sockets. That the sockets may be integrally formed together as the integral connector 138 may help achieve a substantial degree of modularity, and aesthetic benefits.

Similarly, motherboard socket 140 may be molded as an integral unit which may be mounted through its corresponding hole in the front panel 112. Further, motherboard socket 140 may be connected to the printed circuit board by means of connector 178 (see FIGS. 6B and 6C).

Figure 7:
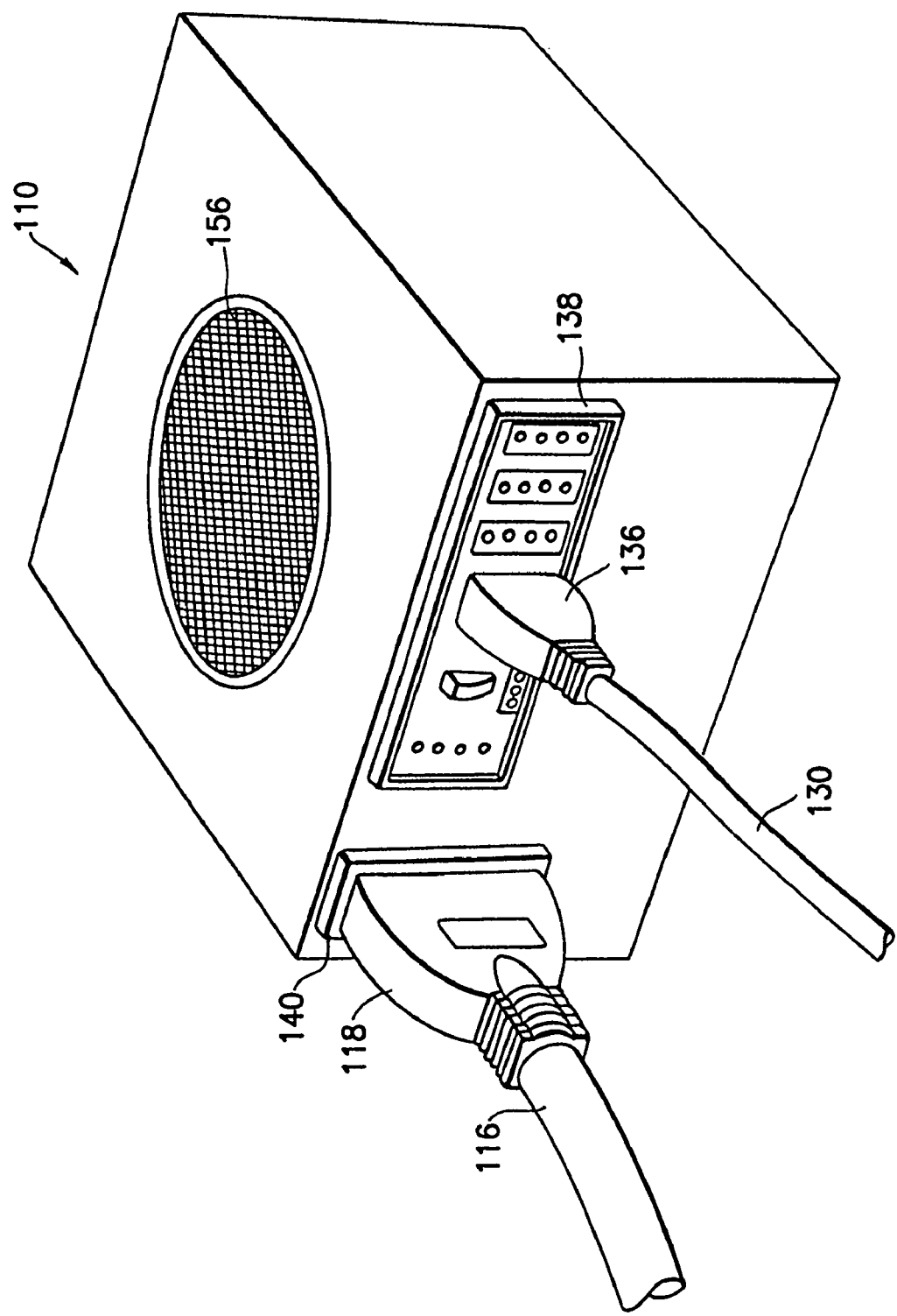
FIG. 7 is a perspective view showing the ease of plugging power supply cables into the respective sockets of the power supply of FIGS. 5 and 6A-6E.

Referring now to FIG. 7, it is again seen that the power supply 110 may facilitate the use of a separate modular motherboard cable 116 (connected to power supply 110 via plug 118 and socket 140) as well as separate modular 12 volt power, auxiliary power and peripheral cables, which can be individually plugged at one end into their respective sockets of the power supply 110 and at their other ends to the respective components inside the device receiving the power, such as a personal computer (this FIG. 7 shows use of only peripheral power cable 130 in addition to modular motherboard cable 116—of course, any other desired combination of cables may be utilized).

Accordingly, only those cables that are needed for a particular configuration need be utilized (in one example (which example is intended to be illustrative and not restrictive), only those cables that are needed for a particular configuration of a personal computer with certain installed components need be utilized). Of course, as additional components are added, additional cables may simply be plugged into the power supply 110 and into the component for use. Likewise, as any components are removed, the respective cables may simply be unplugged from the power supply 110.

Figure 8:
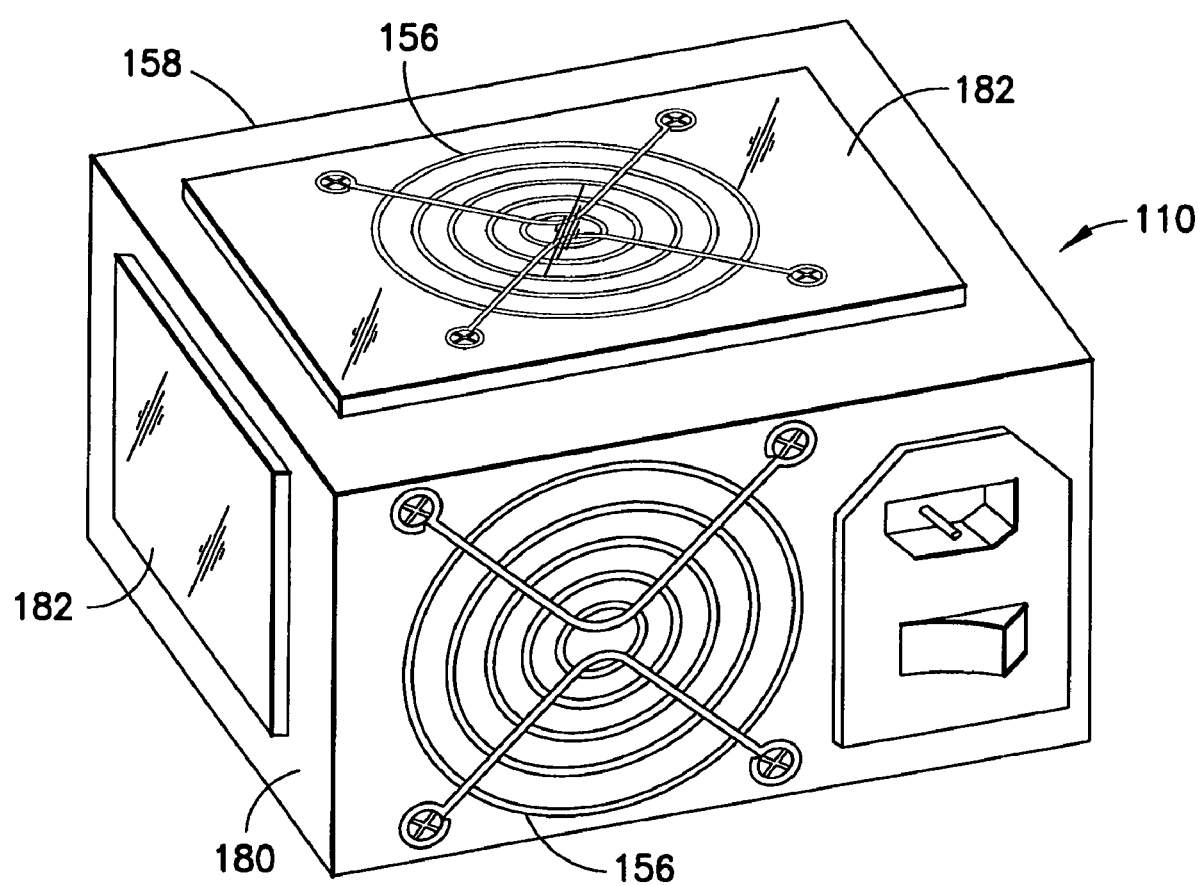
FIG. 8 is a rear perspective view of a computer power supply according to another embodiment of the present invention (in which a portion of various panels of the enclosure are formed of a translucent or clear material which is ultraviolet reactive so as to glow when subjected to ultraviolet radiation)

Further benefits (e.g., aesthetic benefits) may be attained by providing one or more elements that are reactive to ultraviolet (UV) light. For example (which example is intended to be illustrative and not restrictive), one or more panels (e.g., the top panel 158 and/or the side panels 180) may include a transparent or translucent panel insert 182 that is reactive to UV light (see e.g., FIG. 8). In another example (which example is intended to be illustrative and not restrictive), all or part of fan 152 and/or 156 (e.g., the fan housing and/or the fan blades) may be reactive to UV light (see e.g., FIG. 5). In another example (which example is intended to be illustrative and not restrictive), all or part of one or more of the cables removably connected to the power supply may be reactive to UV light.

Of note, any element described herein as being reactive to UV light may be made so by appropriate manufacturing and/or treatment (e.g., an element may have a UV light reactive coating applied thereto and/or an element may be formed (entirely or in part) of a material which is UV light reactive). Further, any element described herein as being reactive to UV light may give off visible light when UV light is applied thereto. In one example (which example is intended to be illustrative and not restrictive), the visible light given off may be of a color selected from the group including, but not limited to: (a) green; (b) blue; (c) red; (d) orange; (e) yellow; and (f) white. In another example (which example is intended to be illustrative and not restrictive), any element described herein as being reactive to UV light may give off visible light of a color which differs from a color of the element when it is not subjected to UV light (e.g., an element which appears clear, transparent, translucent or white in the presence of visible light may appear green, blue or red in the presence of UV light).

In another example (which example is intended to be illustrative and not restrictive), the UV light may be provided at least in part by a UV light source disposed within the power supply (e.g., by an annular UV light positioned concentrically about a fan hub and/or disposed elsewhere within the power supply). In another example (which example is intended to be illustrative and not restrictive), the UV light may be provided at least in part by a UV light source disposed outside of the power supply.

Figure 9A:
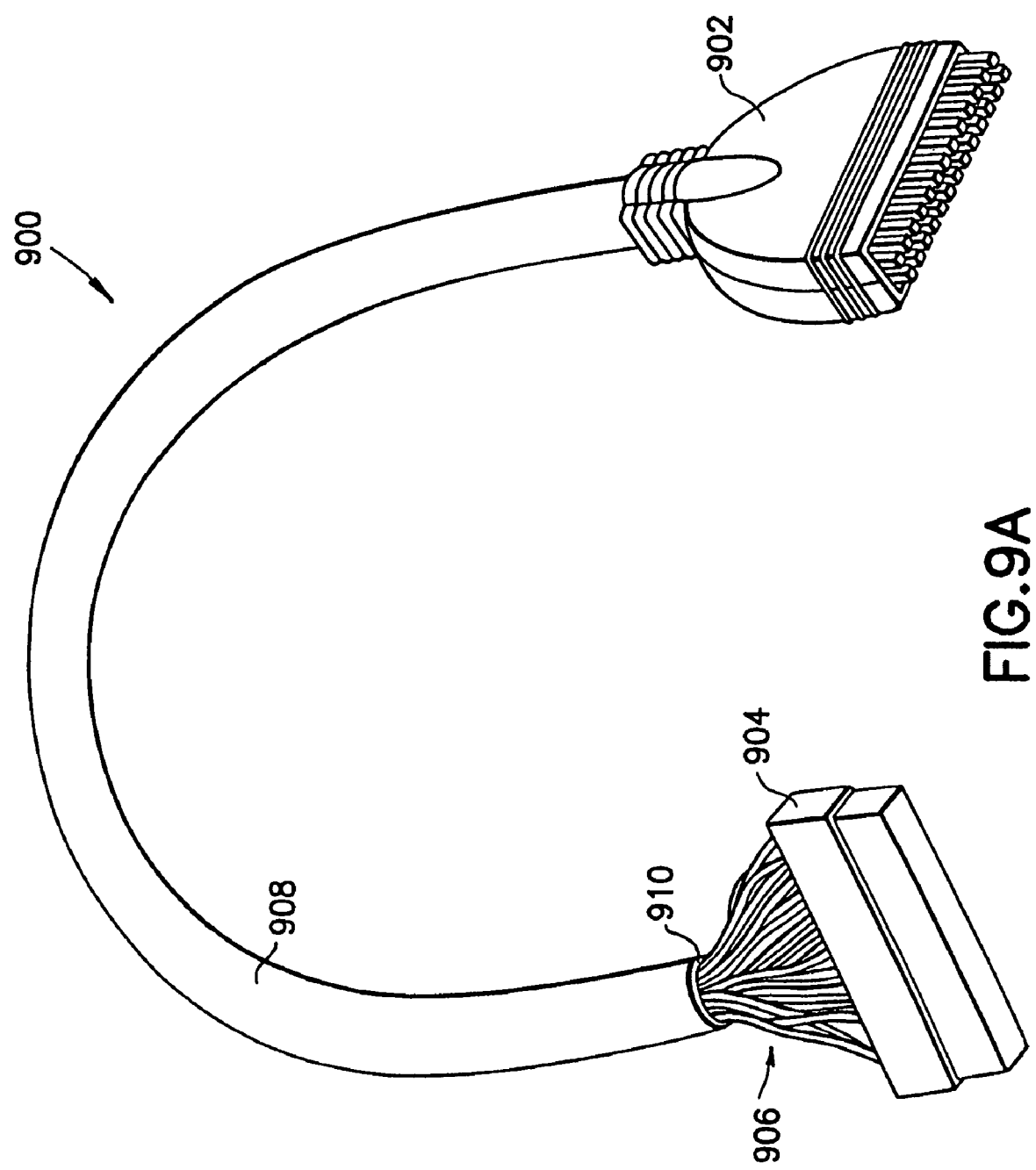
FIGS. 9A and 9B show views of a cable/plug assembly for use with a power supply according to an embodiment of the present invention.

Referring now to FIG. 9A, one example (which example is intended to be illustrative and not restrictive) of a cable/plug assembly for use with a power supply according to an embodiment of the present invention is shown. As seen in this FIG. 9A, the cable assembly 900 includes first plug 902 and second plug 904. As further seen in this FIG. 9A, individual wires 906 may be bundled together within casing 908 and metallic sheath 910 may be utilized to help eliminate or reduce electromagnetic interference.

Of note, this FIG. 9A depicts two types of plugs—first plug 902 (which is a unique plastic injection molded type plug) and second plug 904 (which is a conventional type of plug). While this example shows cable assembly 900 utilizing one of each type of plug, other combinations may, of course, be utilized (e.g., the cable assembly may utilize two unique plastic injection molded type plugs or the cable assembly may utilize two conventional type plugs).

Figure 9B:
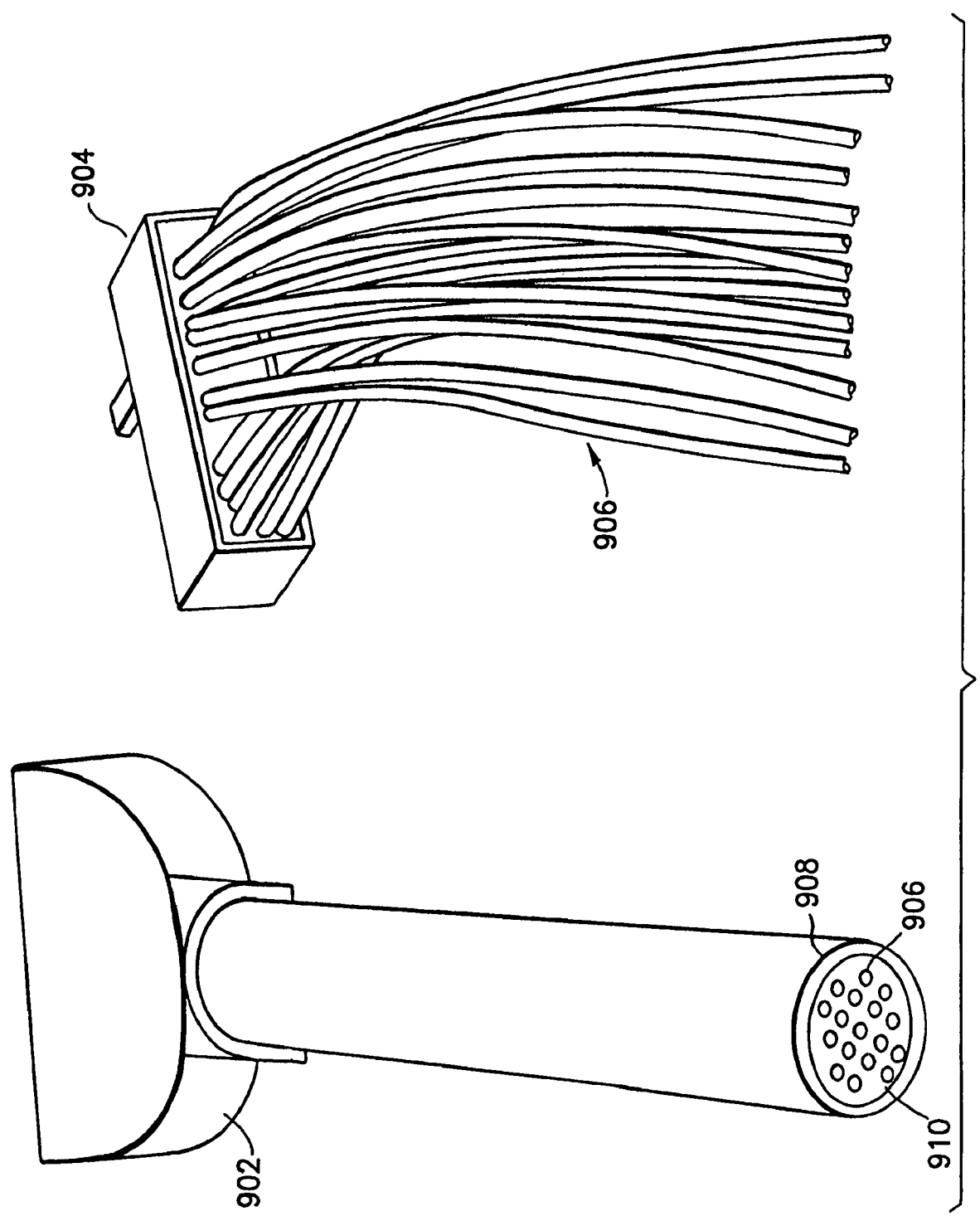

Referring now to FIG. 9B, a more detailed view of the individual wires 906 in the vicinity of each of first plug 902 and second plug 904 is shown. More particularly, the tight containment of individual wires 906 by casing 908 and metallic sheath 910 in the vicinity of first plug 902 is contrasted with the uncontained individual wires 906 in the vicinity of second plug 904.

Referring now to FIGS. 10A-10H, various examples (which examples are intended to be illustrative and not restrictive) of covers for unique plastic injection molded type plugs according to embodiments of the present invention are shown.

Figure 10A:
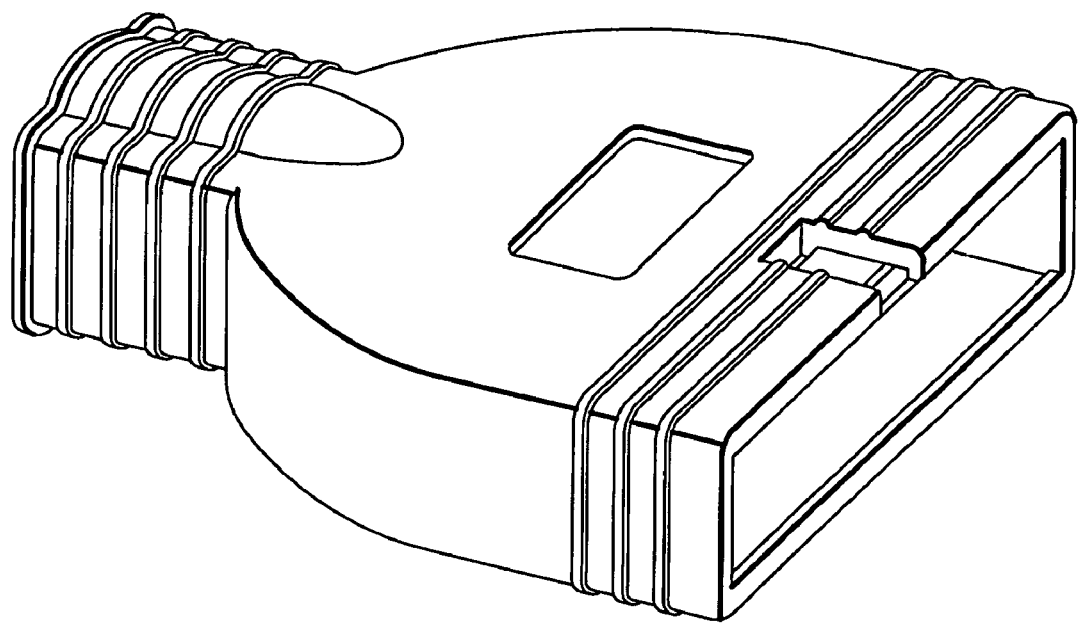
Figure 10B:
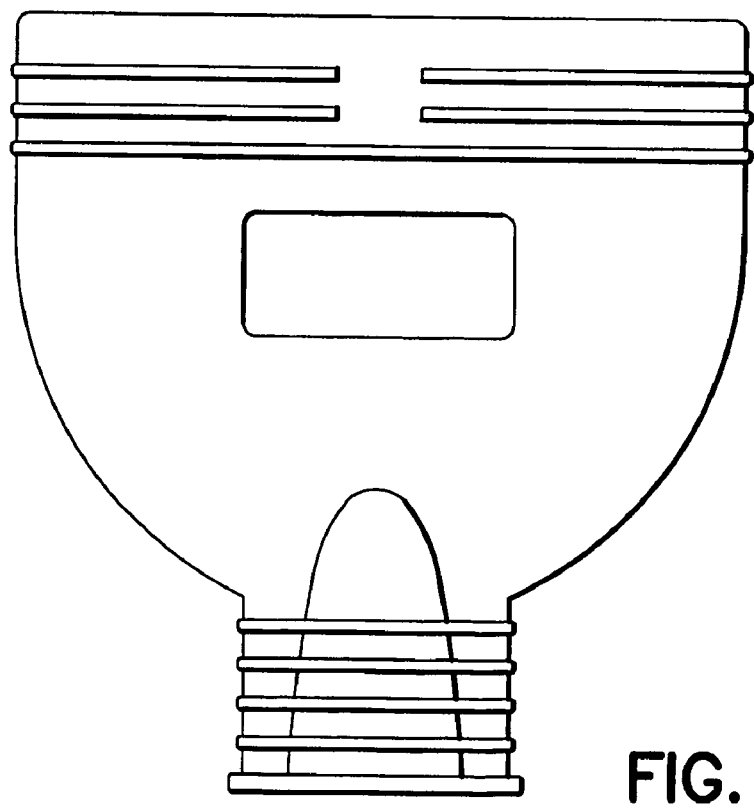
Figure 10C:
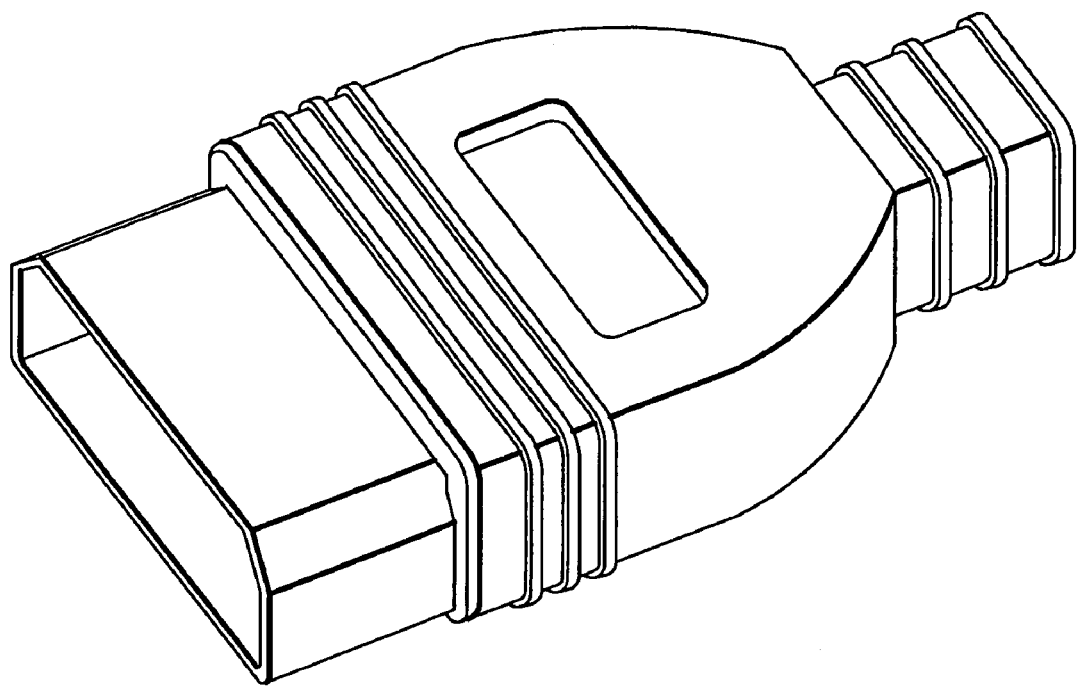
Figure 10D:
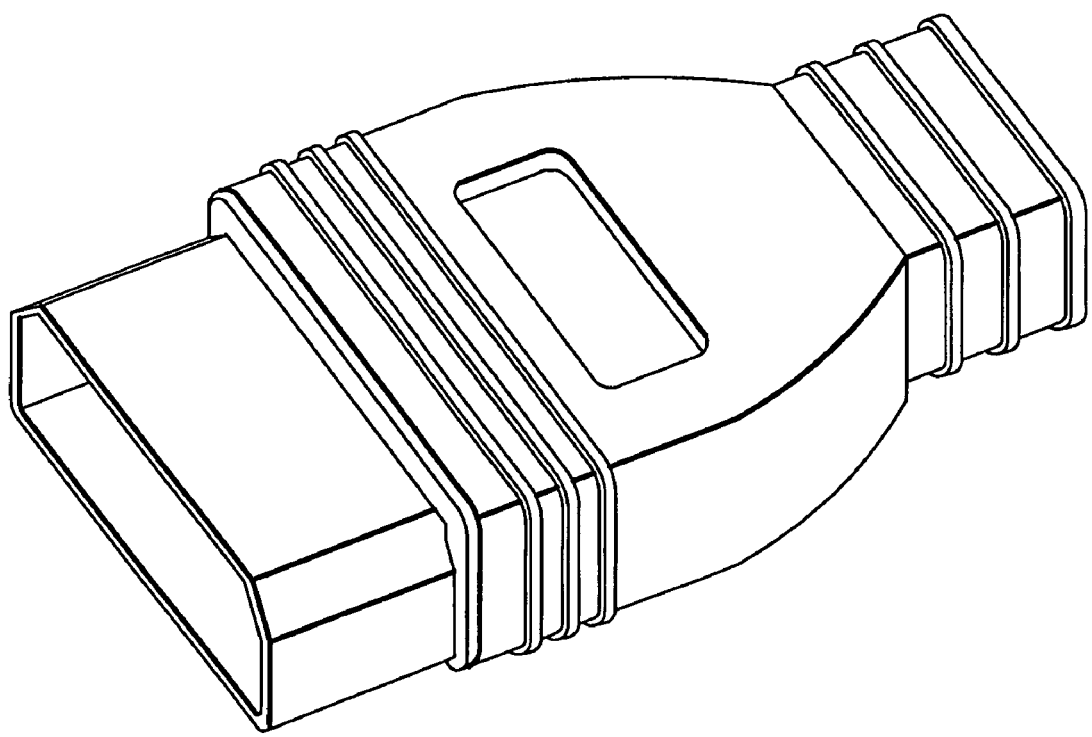
Figure 10E:
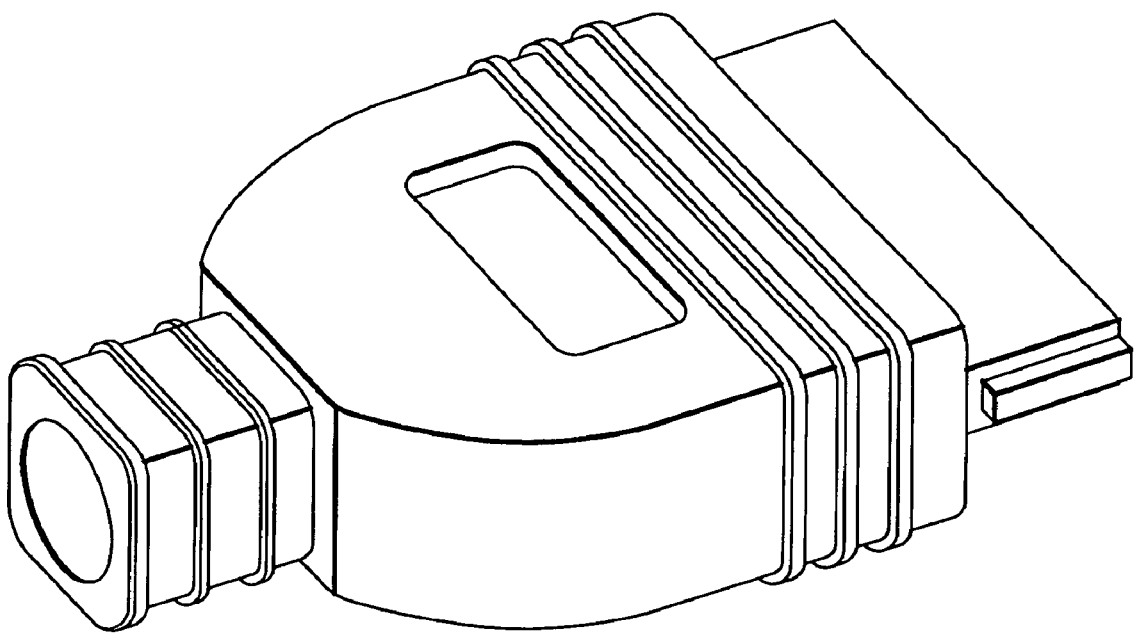
Figure 10F:
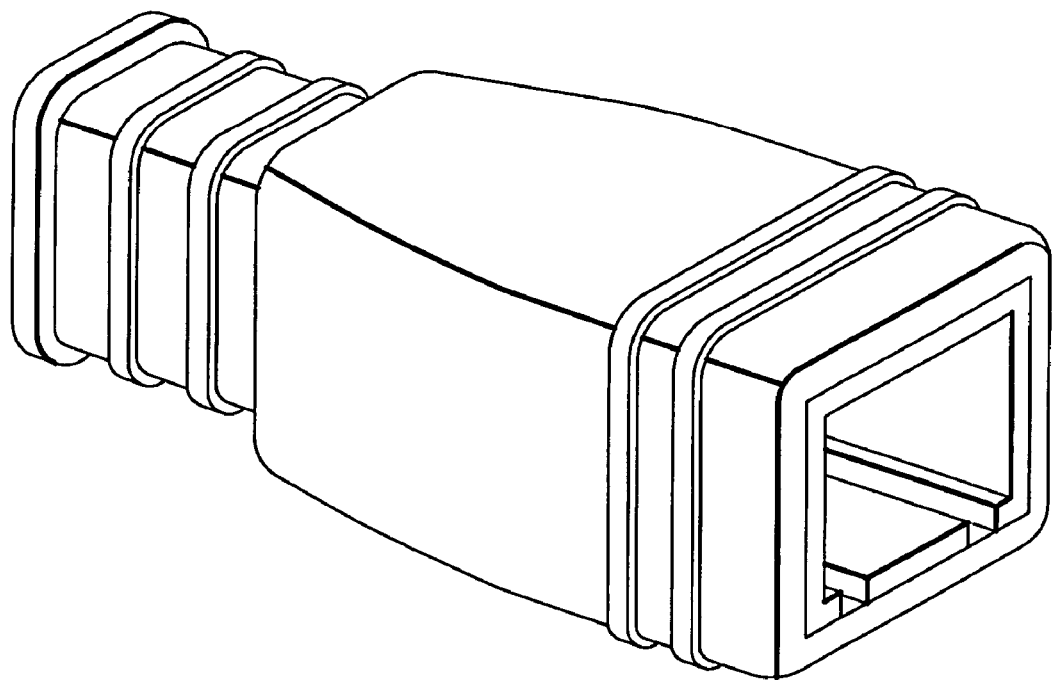
Figure 10G:
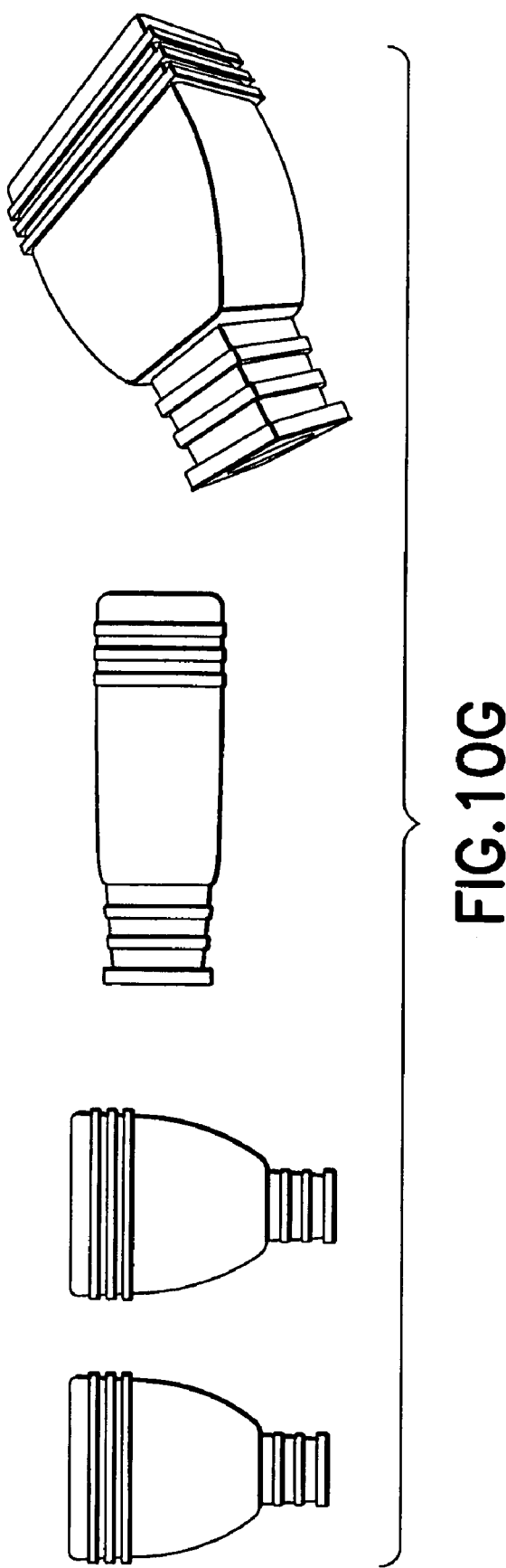

More particularly, FIGS. 10A and 10B show, respectively, a perspective view and a top view of a 24 PIN plastic injection molded cover. Further, FIGS. 10C and 10D show, respectively, perspective views of two types of 4 PIN plastic injection molded covers. Further still, FIG. 10E shows a perspective view of an SATA plastic injection molded cover. Further still, FIG. 10F shows a perspective view of a 3 PIN (for fan) plastic injection molded cover. Further still, FIGS. 10G and 10H show various views of 4 PIN plastic injection molded covers.

Figure 11:
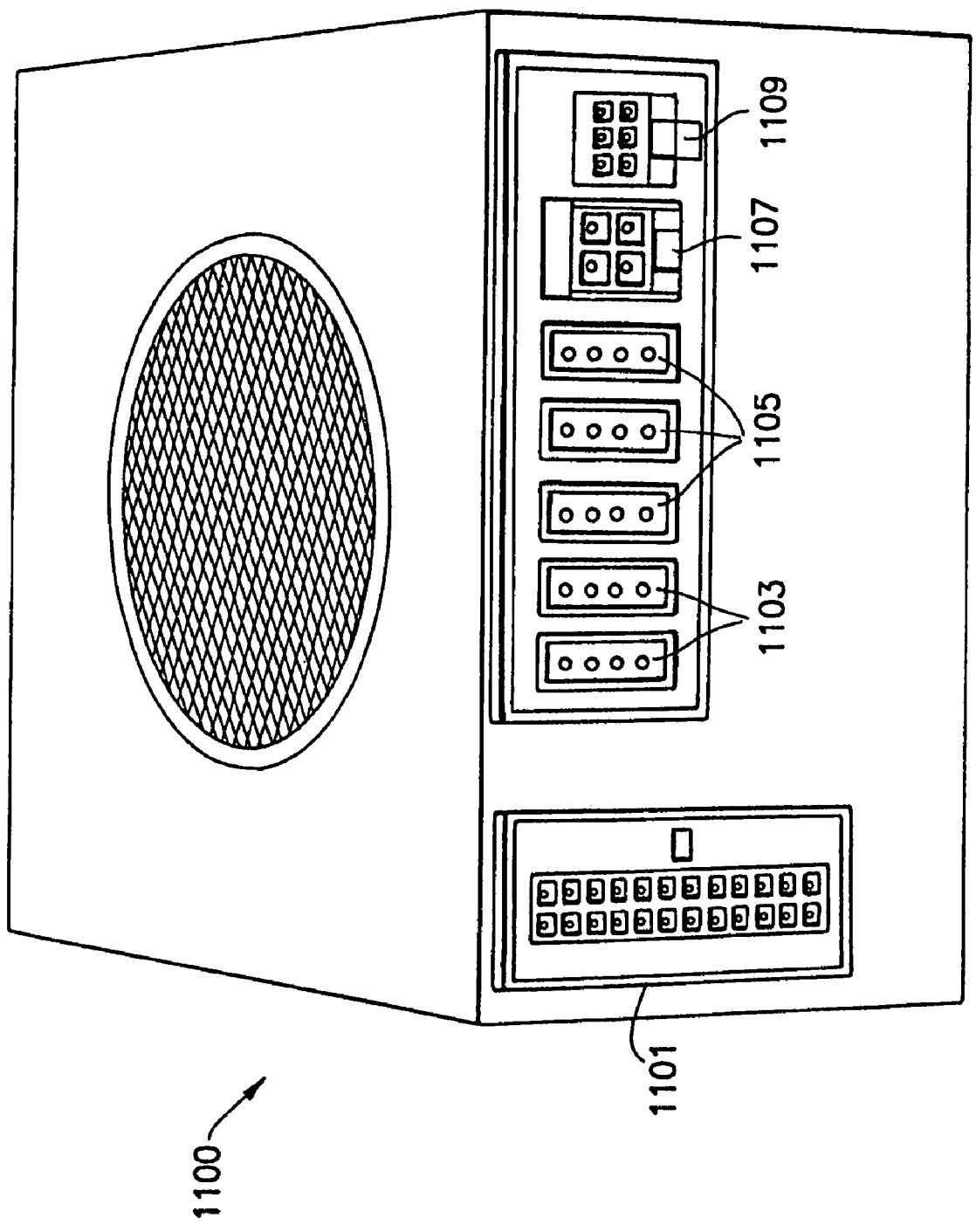
FIG. 11 shows another embodiment of a power supply according to the present invention.

Referring now to FIG. 11, another embodiment of a power supply according to the present invention is shown. More particularly, as seen in this FIG. 11, the power supply 1100 may include 24 pin motherboard socket(s) 1101, SATA2 socket(s) 1103, 12V socket(s) 1105, P4/12V socket(s) 1107 and/or PCI Express socket(s) 1109.

Figure 12:
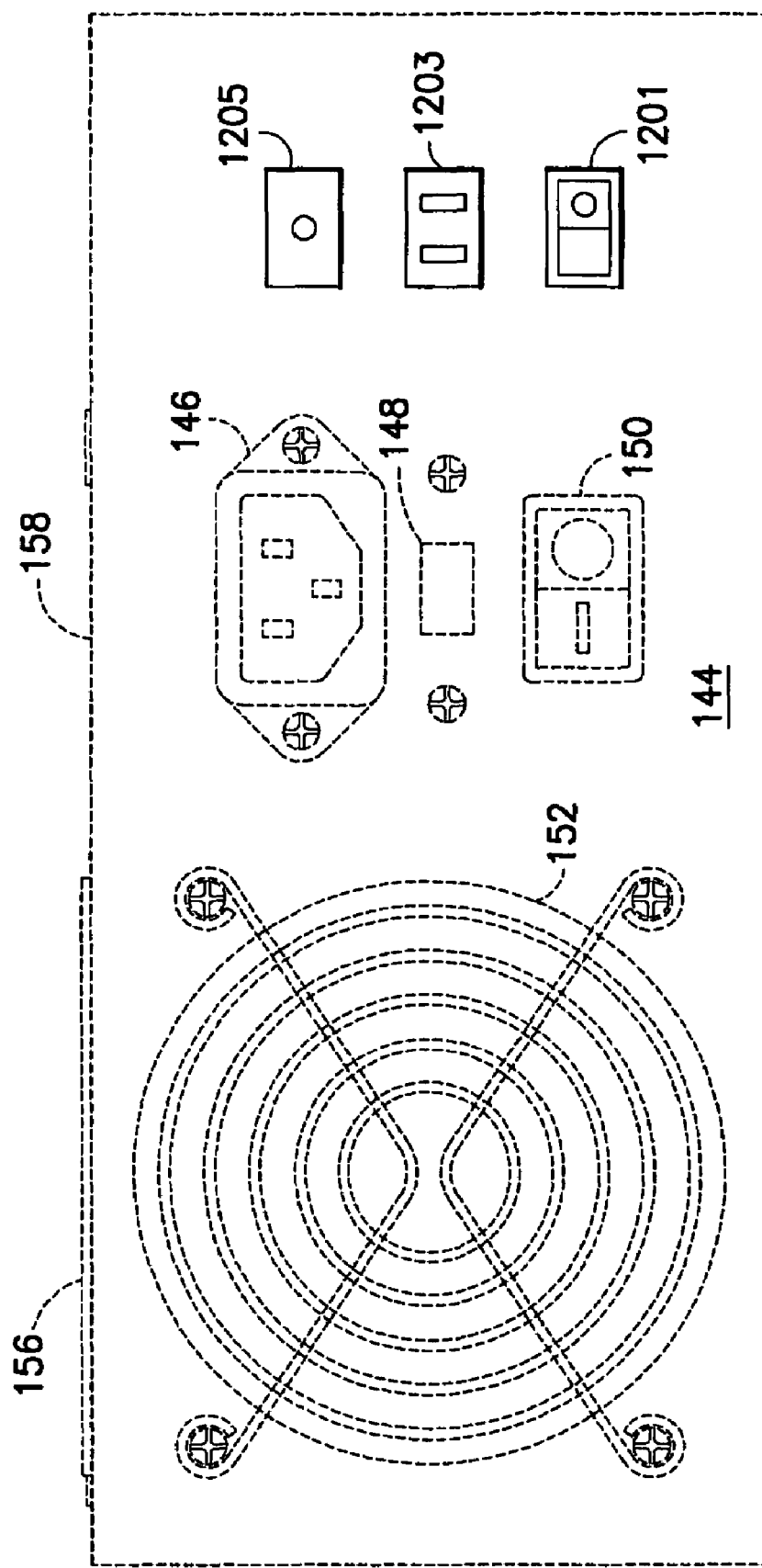
FIG. 12 shows another embodiment of a power supply according to the present invention.

Referring now to FIG. 12, another embodiment of a power supply according to the present invention is shown (this embodiment is similar to the embodiment shown in FIG. 4, with the following additions). More particularly, as seen in this FIG. 12, the power supply may include output switch 1201, AC output socket 1203 (e.g., for outputting 115V or 230V) and/or DC output socket 1205 (e.g., for outputting 3.3V, 5V, 12V). Of note, such output switch 1201, AC output socket 1203 and/or DC output socket 1205 may be accessible from outside of the device in which the power supply is installed (e.g., personal computer). Of further note, either or both of AC output socket 1203 and/or DC output socket 1205 may be switched, that is, capable of being turned on and off (e.g., the AC output socket 1203 and the DC output socket 1205 may be switched together by output switch 1201 or separately by distinct dedicated switches (not shown)). Of still further note, there may be any desired number of AC output sockets 1203 and/or DC output sockets 1205. Of still further note, the AC output socket 1203 and/or DC output socket 1205 may each be of any desired physical and/or electrical configuration (e.g., AC output voltage of 115V and/or 230V; DC output voltage of 3.3V, 5V and/or 12V).

Referring now to FIGS. 13A-13F, various views of a power distribution system according to an embodiment of the present invention are shown. More particularly, these FIGS. 13A-13F show views of a power distribution system for use with a computer (e.g., a personal computer). Of note, such a computer may include an internal frame comprised, for example, of metal and an external case (not shown in these FIGS. 13A-13F) comprised, for example, of plastic. Of further note, in order to maximize clarity, no other components of the computer are shown in these FIGS. 13A-13F.

In any case, it is seen in these FIGS. 13A-13F that power supply 1301 (which may be similar to power supply 110 described in detail above) is attached to frame 1303 (as mentioned above, frame 1303 may be, for example, a metal internal frame covered fully or partially by an external plastic case (not shown)). Also attached to frame 1303 are power distribution sockets 1305A-1305D (of note, such power distribution sockets 1305A-1305D may be configured to receive DC current (e.g., via a hard-wired or removable cable) and/or to supply DC current (e.g., via a hard-wired or removable cable).

Figure 13A:
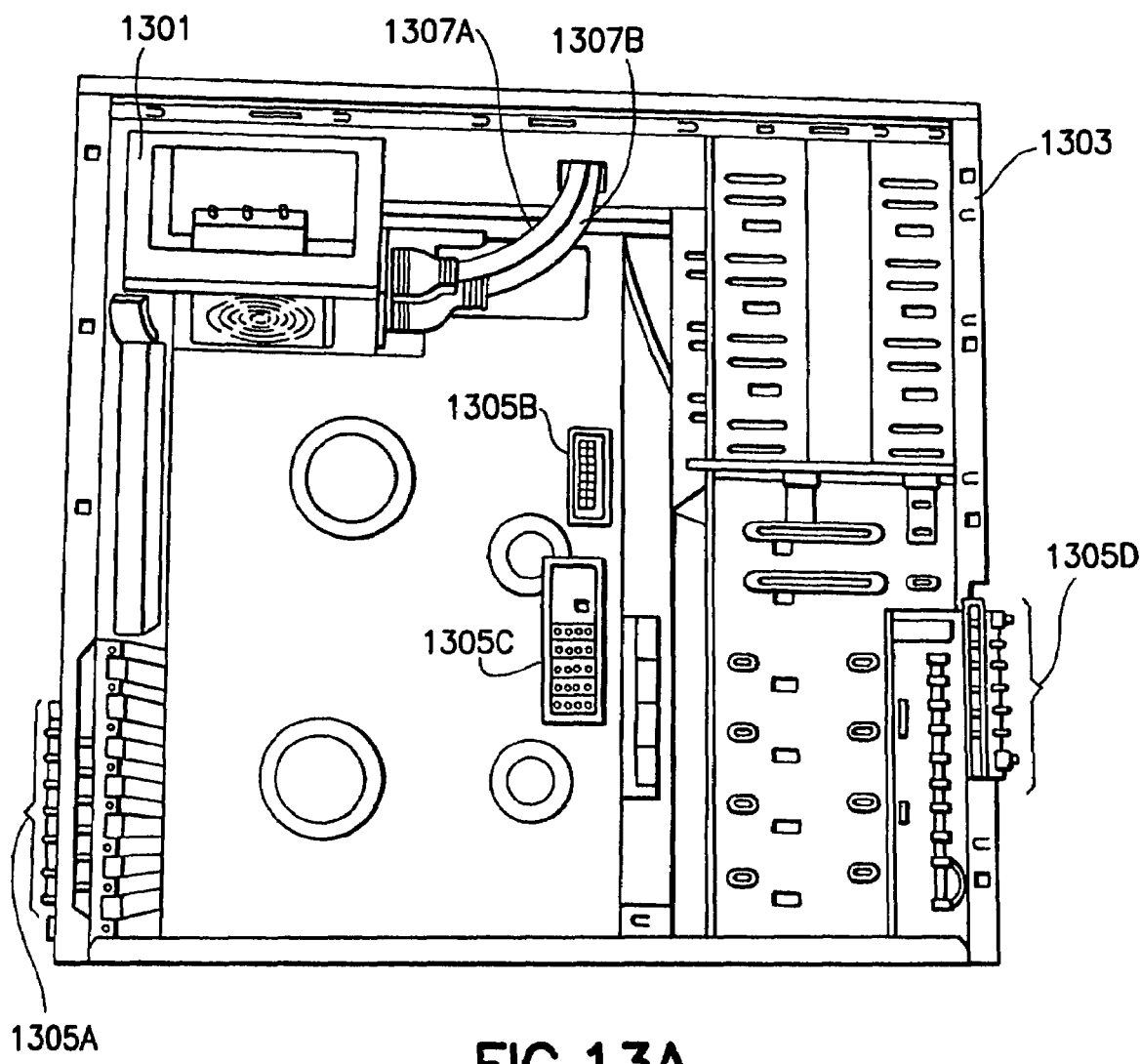
FIGS. 13A-13F show various views of a power distribution system according to an embodiment of the present invention.
Figure 13B:
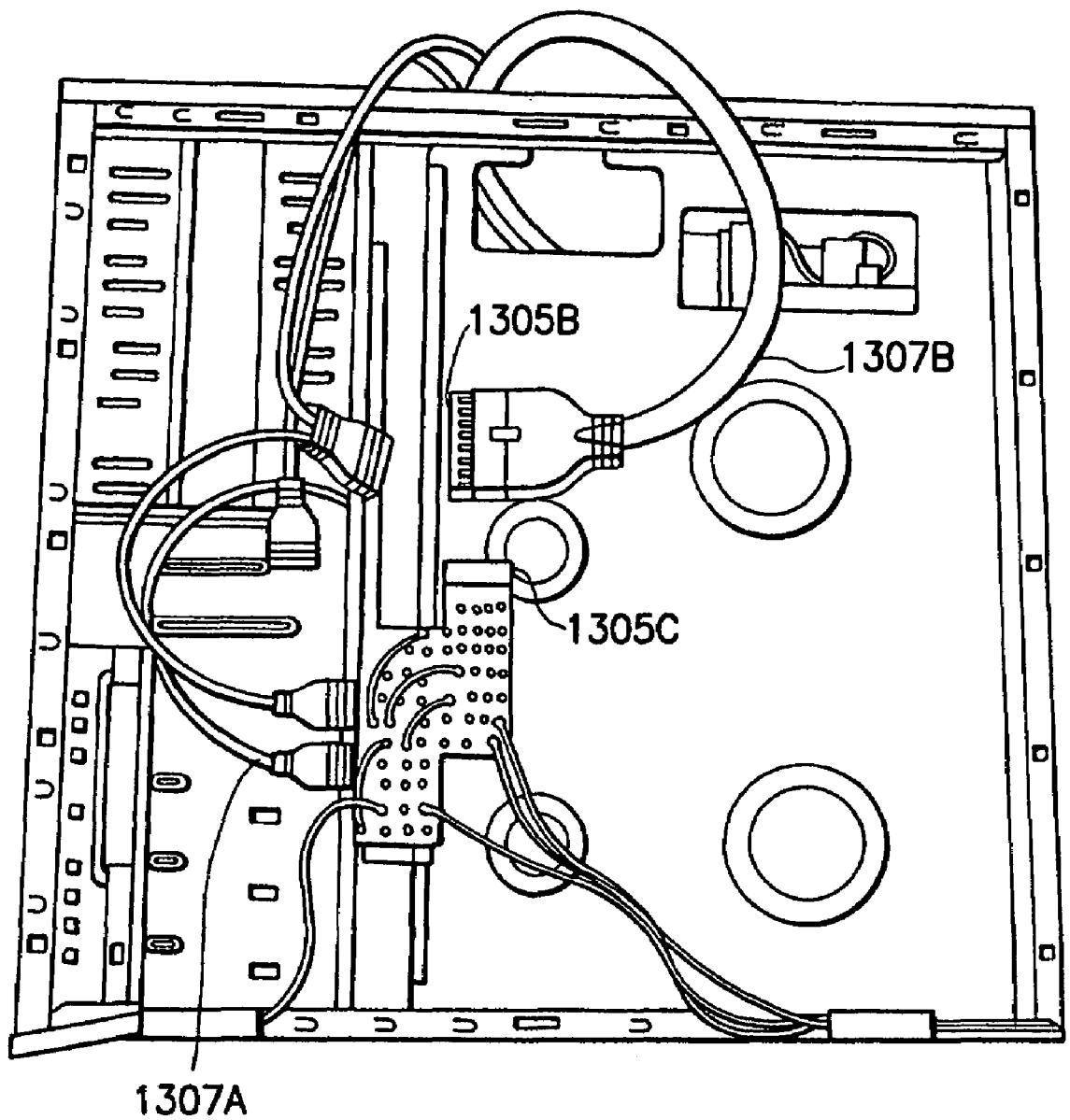
Figure 13C:
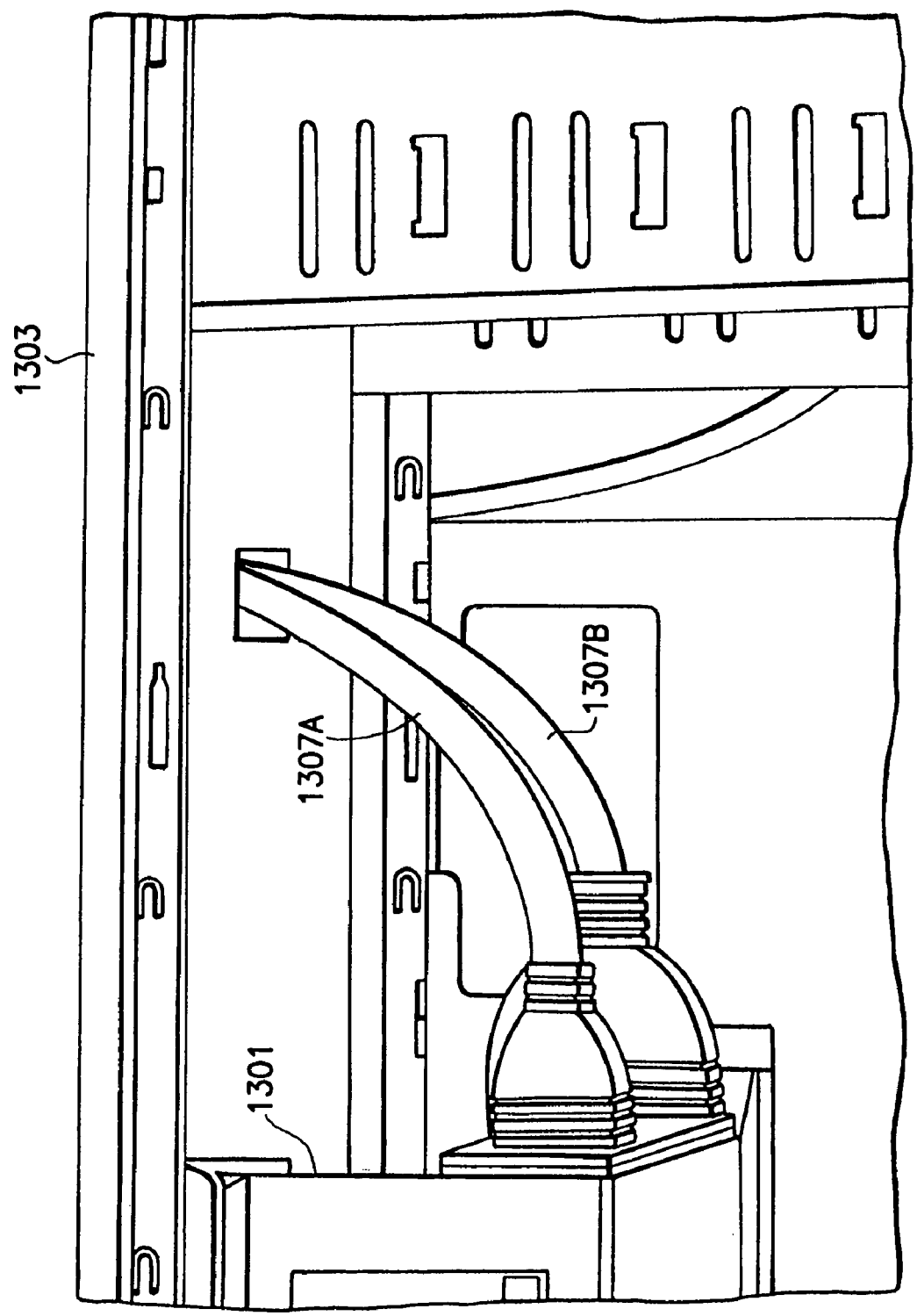
Figure 13D:
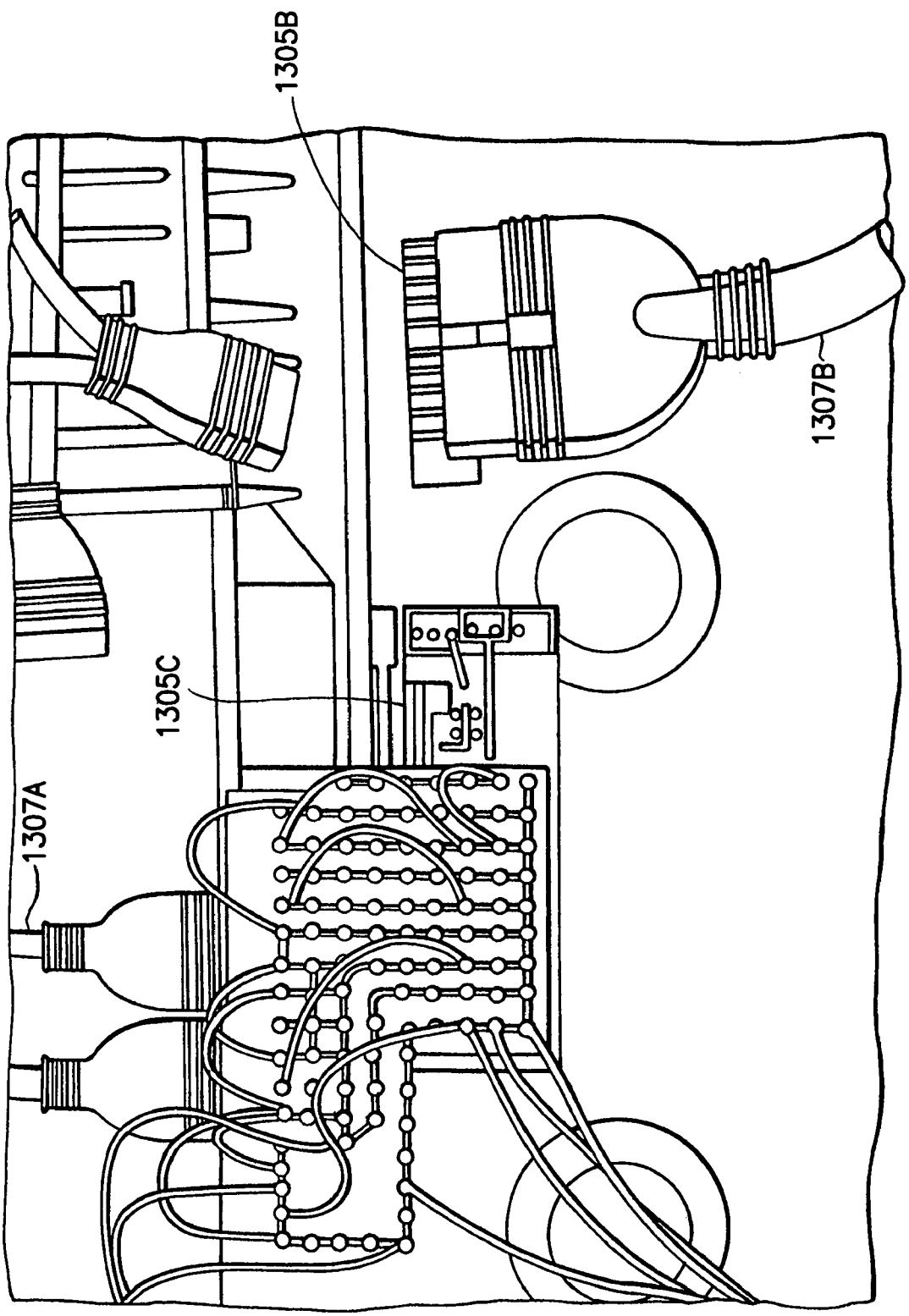

In one example (which example is intended to be illustrative and not restrictive), some of the power distribution sockets 1305A-1305D may be connected via removable cables 1307A and 1307B to power supply 1301 (see first ends of each of removable cables 1307A and 1307B being connected to power supply 1301 in FIG. 13A and second ends of each of removable cables 1307A and 1307B being connected to power distribution sockets 1305B and 1305C in FIG. 13B). In this regard, the various components installed in the computer (not shown in these Figures) may be connected (e.g., via a hard-wired or removable cable) to the power distribution sockets to receive current therefrom). Further, FIG. 13C shows a detail view of removable cables 1307A and 1307B in the vicinity where they connect to power supply 1301 and where they run from an inside of frame 1303 to an outside of frame 1303 (for routing to power distribution sockets 1305B and 1305C). Further still, FIG. 13D shows a detail view of removable cables 1307A and 1307B in the vicinity where they connect to power distribution sockets 1305B and 1305C on the outside of frame 1303. Of note, removable cable 1307A includes a number of plugs at the point of connection to power distribution socket 1305C due to removable cable 1307A having been split-out into multiple cables (see, e.g., FIG. 13B)). Of further note, removable cable 1307A connects to power distribution socket 1305C via a circuit board (shown in the Figures but not separately numbered).

In another example (which example is intended to be illustrative and not restrictive), one or more of the power distribution sockets 1305A-1305D may be connected to one another (and/or to the power supply 1301) to distribute power as required.

Figure 13E:
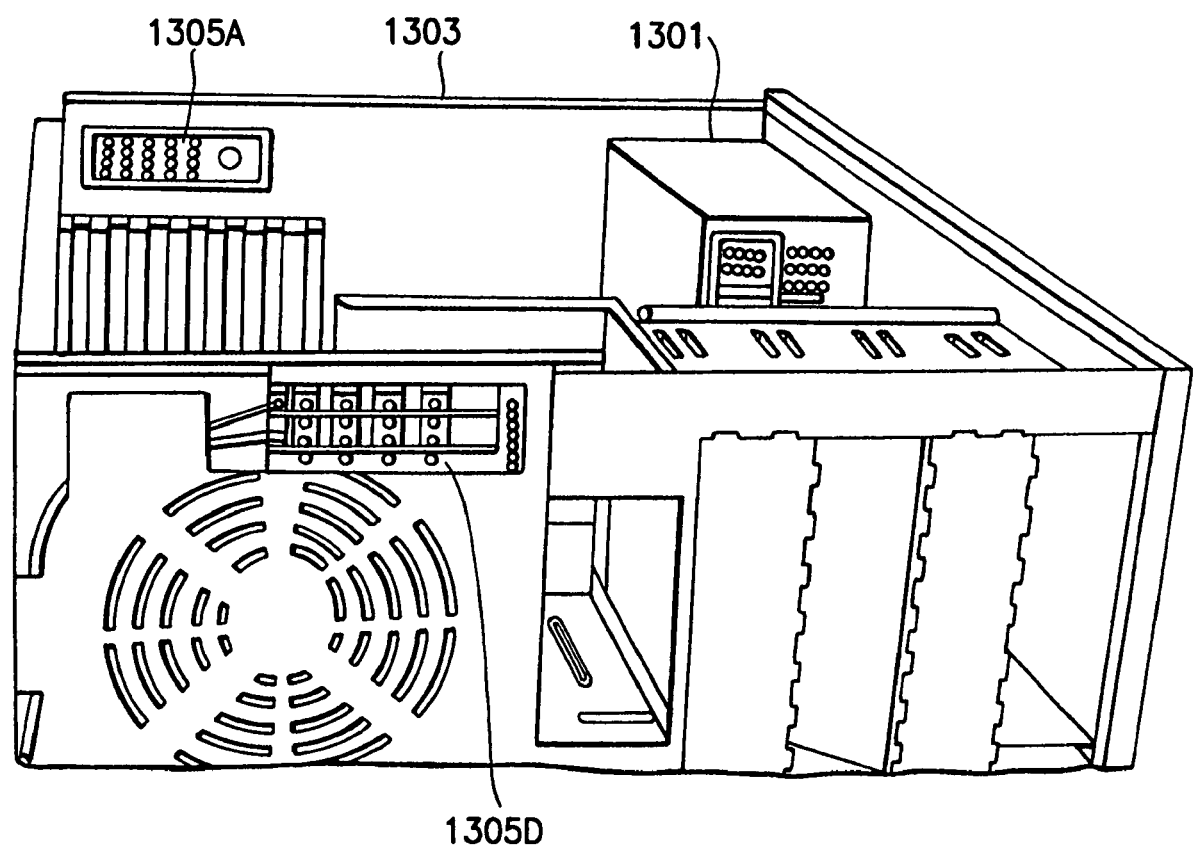
Figure 13F:
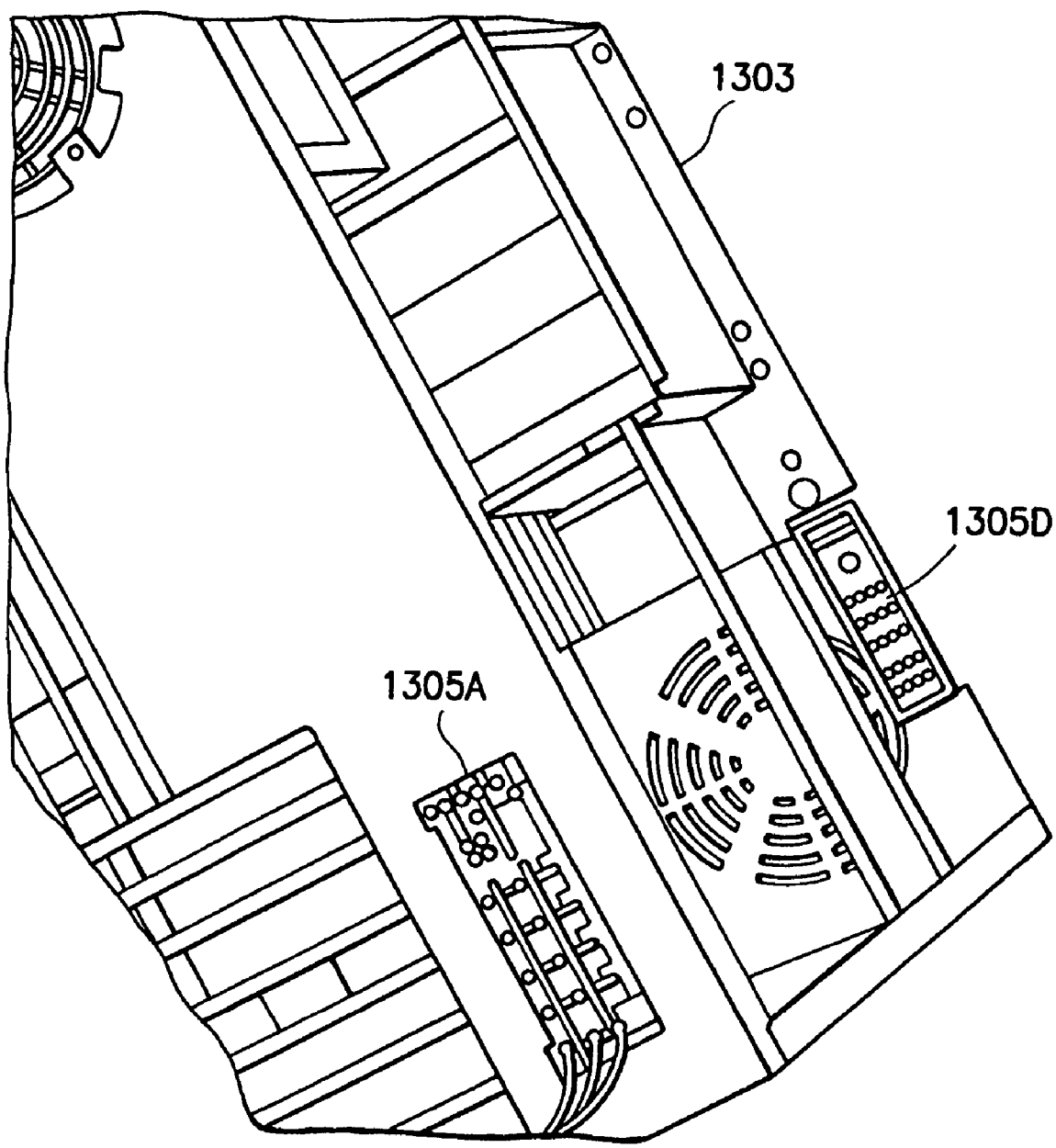

Finally, referring now to FIGS. 13E and 13F, additional views of a power distribution system according to an embodiment of the present invention are shown. More particularly, FIG. 13E shows a view of the power distribution system looking in towards the backside of power distribution socket 1305D and FIG. 13F shows a view of the power distribution system looking in towards the backside of power distribution socket 1305A.

While a number of embodiments of the present invention have been described, it is understood that these embodiments are illustrative only, and not restrictive, and that many modifications may become apparent to those of ordinary skill in the art. For example, while the present invention has been described primarily for use with a computer (e.g., a personal computer), the invention may be used in any device requiring a power supply/power distribution system. Further, each socket may include one or more electrically conductive terminals for interfacing with corresponding electrically conductive terminal(s) of a mating plug (e.g., each socket may have one or more electrically conductive pins for interfacing with corresponding electrically conductive receptacles(s) of a mating plug or each socket may have one or more electrically conductive receptacles for interfacing with corresponding electrically conductive pins(s) of a mating plug). Further still, when multiple sockets are formed into an integral connector, each of the sockets of the integral connector may be of the same type (or form factor) or the integral connector may include sockets of different types (or form factors). Further still, multiple sockets may be provided by forming multiple recesses within an integral connector. Further still, the socket(s) may be mounted to (and/or accessible through) a panel of the housing of the power supply, the case and/or the frame. Further still, each socket may be mounted by being mechanically coupled to a panel of the power supply housing, the case and/or the frame, by being mounted to a printed circuit board located inside the power supply housing, the case and/or frame and/or by being made integral with one or more other sockets (e.g., as part of an integral connector). Further still, the sockets may include one or more electrical terminals disposed within a recess in the socket (whereby the terminals disposed within the recess are protected from making electrical contact with anything other than a mating plug which may be plugged into the socket). Further still, any desired number of sockets may be utilized. Further still, a power supply/power distribution system according to the present invention may receive one or more input voltage/current levels and may supply one or more output voltage/current levels (dedicated input and/or output circuitry may be utilized). Further still, the present invention may utilize one or more proprietary sockets/plugs (as opposed to sockets/plugs of a conventional form factor/electrical configuration). Further still, the sockets may be installed essentially flush with the outer surface of the structure in which they are placed. Further still, the present invention may provide improved airflow within the case and/or the frame of the device being powered by the power supply (e.g., improved airflow within a computer). This improved airflow may result at least in part from the absence of unnecessary cabling and/or the use of the shortest possible cabling. Further still, while 115V and 230V have primarily been used herein with reference to the AC voltage level, it should be appreciated that these may be considered nominal voltages and other voltages may of course be used with the invention (e.g., 110V, 120V, 220V, 240V). Further still, one or more of the sockets may be covered by one or more removable covers (e.g., to help prevent the shorting-out of the electrical terminals and/or to help prevent dust or debris from collecting in the sockets). Further still, any desired part(s) of the power supply/power distribution system may be UV light reactive and/or may produce UV light. Further still, each removable cable may be disposed: (a) entirely within the internal frame; (b) at least partially within the internal frame and at least partially outside the internal fame; (c) entirely outside the internal frame; (d) entirely within the case; (e) partially inside the case and partially outside the case; (f) entirely outside the case; and (g) any combination thereof. Further still, any steps described herein may be carried out in any desired order.

What is claimed is:

1. A power distribution system, comprising:
a power supply housing having an interior volume defined by a top panel, a bottom panel and a plurality of side panels;
AC to DC circuitry disposed within the interior volume of the power supply housing;
at least two DC output sockets, wherein each DC output socket is fixed to one of the top panel, bottom panel and side panels defining the interior volume of the power supply in which the AC to DC circuitry is disposed;
at least two DC distribution sockets, wherein each DC distribution socket is remote from the power supply housing and is fixed to an internal frame at least partially covered by a computer case; and
a plurality of removable cables, each having two ends;
wherein the AC to DC circuitry receives AC current from an AC current source;
wherein the AC to DC circuitry converts the received AC current into DC current and supplies the DC current to each DC output socket;
wherein each DC output socket is fixed to one of the panels of the power supply housing in a position such that when the power supply is installed within the computer case each DC output socket is disposed inside of the computer case such that a respective one of the plurality of removable cables is removably connected between a single respective one of the DC output sockets and a single respective one of the DC distribution sockets;
wherein a component which is to receive DC current is disposed inside of the computer case and the component receives the DC current from at least one of the DC distribution sockets; and
wherein the component disposed within the computer case is selected from the group including: (a) a motherboard; (b) a magnetic disc drive; (c) an optical disc drive; (d) an input/output card; (e) a memory card; (f) a sound card; (g) a gaming card; (h) a video card; (i) a network card; (j) network hub; and (k) a cooling device.

2. The power distribution system of claim 1, wherein each DC output socket is fixed to one of the panels of the power supply housing in a position such that when the power supply is installed within the computer case each DC output socket is disposed inside of the computer case such that a respective removable cable is: (a) removably connected between the single respective DC output socket and the single respective DC distribution socket; and (b) resides entirely within the computer case.

3. The power distribution system of claim 1, wherein at least one of the DC distribution sockets is connected to another of the DC distribution sockets to supply DC current thereto.

4. The power distribution system of claim 1, wherein the computer case is a case for a personal computer.

5. The power distribution system of claim 1, wherein each removable cable is removably connected to a respective DC output socket via a first plug and is removably connected to a respective DC distribution socket via a second plug.

6. The power distribution system of claim 1, wherein the power supply housing is formed from a plurality of housing elements which interface in a cooperative manner to define the top panel, the bottom panel and the plurality of side panels.

7. The power distribution system of claim 1, wherein at least one of the top panel, the bottom panel and one of the plurality of side panels includes an insert element which is reactive to UV light.

8. The power distribution system of claim 1, wherein the power supply includes at least one fan assembly including a fan housing and a fan blade and at least one of the fan housing and the fan blade is reactive to UV light.

9. The power distribution system of claim 1, wherein at least a portion of the removable cable is reactive to UV light.

10. The power distribution system of claim 5, wherein at least one of the first and second plugs is formed by plastic injection molding.

11. The power distribution system of claim 6, wherein the power supply housing is formed from two housing elements which interface in a cooperative manner to define the top panel, the bottom panel and the plurality of side panels.

12. The power distribution system of claim 7, wherein the insert element gives off visible light when UV light is applied thereto.

13. The power distribution system of claim 8, wherein at least one of the fan housing and the fan blade gives off visible light when UV light is applied thereto.

14. The power distribution system of claim 9, wherein at least a portion of the removable cable gives off visible light when UV light is applied thereto.

15. The power distribution system of claim 10, wherein at least one of the first and second plugs is formed of a first plug half and a second plug half which interface in a cooperative manner to form the plug.

16. The power distribution system of claim 12, wherein the insert element gives off visible light of a color selected from the group including: (a) green; (b) blue; (c) red; (d) orange; (e) yellow; and (f) white.

17. The power distribution system of claim 13, wherein at least one of the fan housing and the fan blade gives off visible light of a color selected from the group including: (a) green; (b) blue; (c) red; (d) orange; (e) yellow; and (f) white.

18. The power distribution system of claim 14, wherein at least a portion of the removable cable gives off visible light of a color selected from the group including: (a) green; (b) blue; (c) red; (d) orange; (e) yellow and (f) white.

* * * * *